United States Patent
Pratt

(10) Patent No.: US 10,700,722 B1
(45) Date of Patent: Jun. 30, 2020

(54) FREQUENCY-SEGMENTED POWER AMPLIFIER

(71) Applicant: Analog Devices International Unlimited Company, Limerick (IE)

(72) Inventor: Patrick Pratt, Mallow (IE)

(73) Assignee: ANALOG DEVICES INTERNATIONAL UNLIMITED COMPANY, Limerick (IE)

( * ) Notice: Subject to any disclaimer, the term of this patent is extended or adjusted under 35 U.S.C. 154(b) by 0 days.

(21) Appl. No.: 16/398,638

(22) Filed: Apr. 30, 2019

(51) Int. Cl.
| | |
|---|---|
| H03H 7/30 | (2006.01) |
| H04B 1/04 | (2006.01) |
| H04L 25/03 | (2006.01) |
| H04B 3/06 | (2006.01) |
| H03F 3/21 | (2006.01) |
| H03F 1/02 | (2006.01) |

(52) U.S. Cl.
CPC ........... *H04B 1/0475* (2013.01); *H03F 3/211* (2013.01); *H04B 3/06* (2013.01); *H04L 25/03343* (2013.01); *H03F 1/0288* (2013.01); *H03F 2200/63* (2013.01); *H03F 2203/21106* (2013.01); *H03F 2203/21142* (2013.01); *H04B 2001/0425* (2013.01)

(58) Field of Classification Search
CPC .................................................. H04B 1/0475; H04B 3/06; H04B 2001/0425; H04L 25/03343; H03F 3/211; H03F 2200/63; H03F 2203/21106; H03F 2203/21142; H03F 1/0288
See application file for complete search history.

(56) References Cited

U.S. PATENT DOCUMENTS

| | | | |
|---|---|---|---|
| 6,175,551 B1 | 1/2001 | Awater et al. | |
| 7,697,591 B2 | 4/2010 | Copeland | |
| 7,863,976 B1 | 1/2011 | Loeb et al. | |
| 8,044,716 B1 | 10/2011 | Loeb et al. | |
| 8,138,829 B2 | 3/2012 | Reddy et al. | |
| 9,660,675 B2* | 5/2017 | Pratt | H03F 3/19 |
| 1,003,341 A1 | 7/2018 | Pratt | |
| 1,006,326 A1 | 8/2018 | Pratt | |
| 1,009,723 A1 | 10/2018 | Pratt | |
| 1,022,497 A1 | 3/2019 | Pratt | |
| 10,305,428 B1* | 5/2019 | Yang | H03D 7/1466 |
| 10,320,340 B1* | 6/2019 | Pratt | H03F 1/3247 |

(Continued)

OTHER PUBLICATIONS

Feucht, *High-Efficiency Analog Amplifiers, Part 3: Optimal Parallel-Segmented Voltages*, Planet Analog, All Signal, No Noise, Mar. 5, 2019, 5 pages.

(Continued)

*Primary Examiner* — Dhaval V Patel
(74) *Attorney, Agent, or Firm* — Patent Capital Group

(57) ABSTRACT

An example communication system includes a frequency-segmented power amplifier (PA) circuit that includes a plurality of PA segments. Each PA segment is configured to amplify a portion of a PA input signal in a different frequency band to generate a respective output signal (PA segment output signal). The frequency-segmented PA circuit further includes a combiner, configured to combine PA segment output signals from different PA segments to provide a power-amplified version of the PA input signal. Implementing such a frequency-segmented PA circuit may result in significant improvement in PA efficiency.

21 Claims, 13 Drawing Sheets

(56) References Cited

U.S. PATENT DOCUMENTS

| | | |
|---|---|---|
| 2014/0169496 A1 | 6/2014 | Yang et al. |
| 2015/0098524 A1* | 4/2015 | Ling ................ H04B 1/0475 375/297 |
| 2016/0043754 A1* | 2/2016 | Robert ............. H04B 1/0475 455/114.3 |
| 2017/0338841 A1 | 11/2017 | Pratt |
| 2017/0338842 A1 | 11/2017 | Pratt |
| 2018/0167091 A1 | 6/2018 | Pratt et al. |
| 2018/0191314 A1 | 7/2018 | Pratt et al. |
| 2018/0309465 A1 | 10/2018 | Pratt |

OTHER PUBLICATIONS

Niknejad, *PowerAmplifiersfor Communications*, Integrated Circuits for Communication, Berkeley, © 2014, 50 pages.

Beek, *Multi-carrier single-DAC transmitter approach applied to digital cable television*, Eindhoven University of Technology, Jan. 1, 2011, DOI: 10.6100/IR716353, 327 pages.

Pratt et al., *Ultrawidebanal Digital Predistortion (DPD): The Rewards (Power and Performance) and Challenges of Implementation in Cable Distribution Systems*, Analog Devices, AnalogDialogue 51-07, Jul. 2017, 7 pages.

* cited by examiner

FREQUENCY-SEGMENTED POWER AMPLIFIER

TECHNICAL FIELD OF THE DISCLOSURE

The present disclosure generally relates to communication systems such as cable communication systems and wireless communication systems and, in particular, to power amplifiers used in such systems.

BACKGROUND

The first cable communication systems started to appear in the early '50s. Even with the rapid changes in technology and distribution methods, cable has maintained a prominent position as a conduit for the distribution of data. Wireless communication systems are more recent, with one prominent example being wireless cellular (mobile) communication systems, with Long Term Evolution (LTE) and $5^{th}$ generation (5G) being the latest generation technologies at the moment. Both, systems used for cable communication such as cable television networks and systems used for wireless communication such as LTE or 5G, are radio systems in that they transmit and receive signals in the form of electromagnetic waves in the radio frequency (RF) range of approximately 3 kiloHertz (kHz) to 300 gigaHertz (GHz). In both of these types of systems a power amplifier (PA) for amplifying RF signals prior to transmission is a crucial component.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Overview

Figure 1:
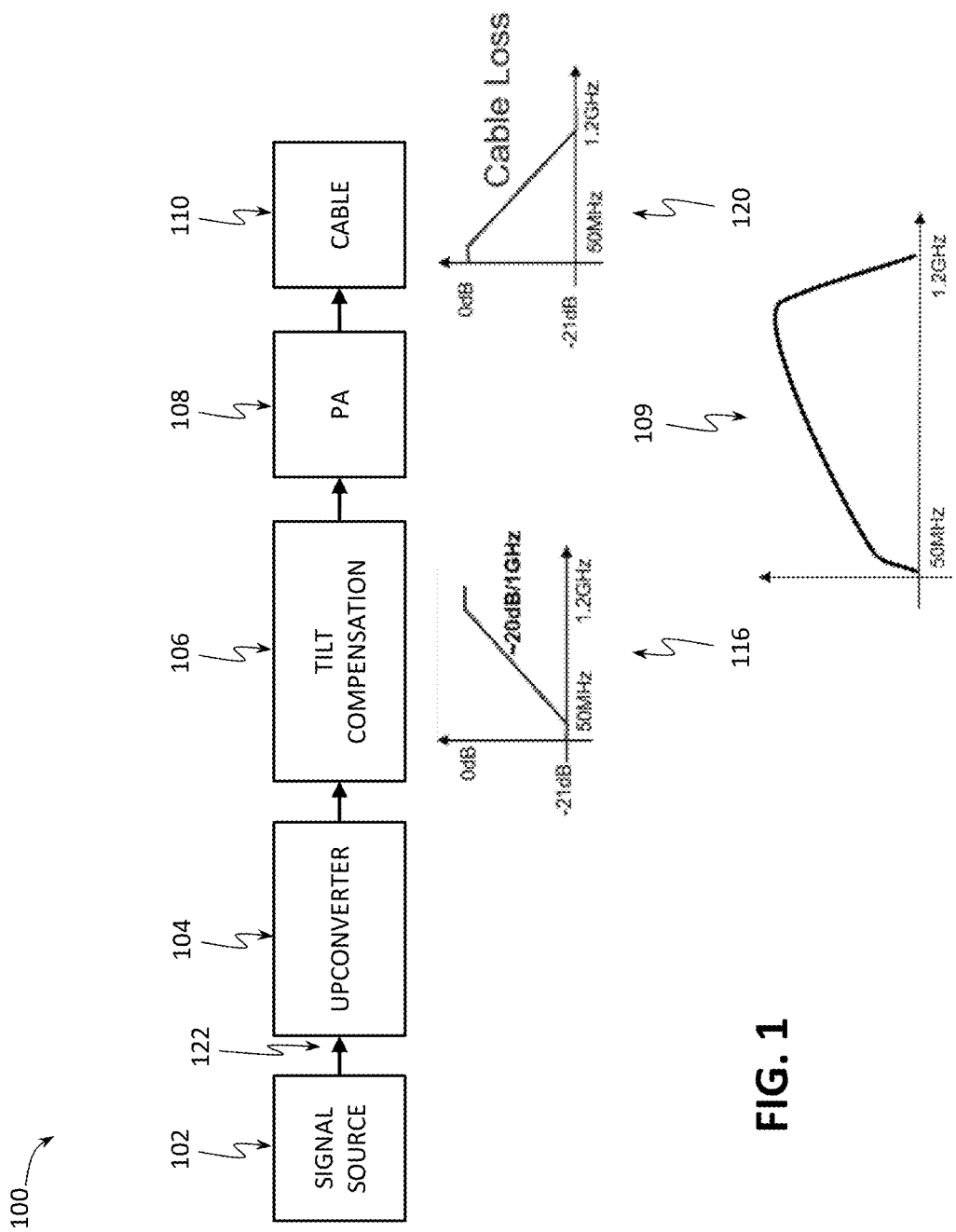
FIG. 1 illustrates a cable communication system, according to some embodiments of the present disclosure.

The systems, methods and devices of this disclosure each have several innovative aspects, no single one of which is solely responsible for the all of the desirable attributes disclosed herein. Details of one or more implementations of the subject matter described in this specification are set forth in the description below and the accompanying drawings.

In one aspect, an example communication system includes a frequency-segmented PA circuit that includes a plurality of PA segments. Each PA segment is configured to amplify a portion of a PA input signal in a different frequency band to generate a respective output signal referred to herein as a "PA segment output signal." The frequency-segmented PA circuit further includes a combiner (e.g., an adder), configured to combine the PA segment output signals from the plurality of PA segments to provide a power-amplified version of the PA input signal (i.e., to provide a PA output signal, provided at the output of the frequency-segmented PA circuit). Implementing a frequency-segmented power amplification may result in significant improvement in PA efficiency, which may, in turn, allow reducing bias currents (and, therefore, reduce power consumption) to achieve the desired linearity performance of a PA circuit.

In some embodiments, such a frequency-segmented PA circuit may be used in a wireless communication system, e.g., in an LTE or a 5G system or in any future wireless communication systems. In other embodiments, such a frequency-segmented PA circuit may be used in a cable communication system, e.g., in a cable television network. In case of the latter, the PA input signal may be a signal based on an output of a tilt compensation circuit, such output signal referred to herein as a "TC output signal," that may be implemented in a cable communication system.

As used herein, describing a signal A as being "based on" a signal B is used to cover both, embodiments where the signal A is the same as signal B, and embodiments where the signal A is a version of the signal B that has undergone some further signal processing such as conversion of the signal B from an analog to a digital domain or vice versa, frequency up or down conversion of the signal B, applying some other modification to the signal B, such as digital predistortion, etc. For example, an input signal to the TC circuit, referred to herein as a "TC input signal," may be based on a signal output from a signal source, which may mean that, in some embodiments, the TC input signal may be the signal provided by the signal source, but, in other embodiments, the input signal may be a version of the signal provided by the signal source that has undergone some further signal processing (e.g., digital-to-analog conversion, frequency upconversion, digital predistortion, etc.). In another example, the PA input signal being based on the TC output signal means that, in some embodiments, the PA input signal may be the TC output signal, but, in other embodiments, the PA input signal may be a version of the TC output signal that has undergone some further signal processing (e.g., some filtering or attenuation, whether that is done deliberately or not).

As used herein, "different frequency bands" refer to frequency bands which include at least some frequencies which are different from each of the other bands. Such frequency bands do not have to, but may also include some frequency components of the same frequencies. For example, a first frequency band of 50 to 400 MHz is considered to be a different frequency band from a second frequency band of 350 to 800 MHz because the first frequency band includes frequencies of 50 up to 350 MHz not included in the second frequency band.

As will be appreciated by one skilled in the art, aspects of the present disclosure, in particular aspects of frequency-segmented power amplification in various communication systems as described herein, may be embodied in various manners—e.g. as a method, a system, a computer program product, or a computer-readable storage medium. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "circuit," "module" or "system." Functions described in this disclosure may be implemented as an algorithm executed by one or more hardware processing units, e.g. one or more microprocessors, of one or more computers. In various embodiments, different steps and portions of the steps of any methods described herein may be performed by different processing units. Furthermore, aspects of the present disclosure may take the form of a computer program product embodied in one or more computer-readable medium(s), preferably non-transitory, having computer-readable program code embodied, e.g., stored, thereon. In various embodiments, such a computer program may, for example, be downloaded (updated) to the existing devices and systems (e.g. to the existing cable or wireless communication transmitters, receivers, and/or their controllers, etc.) or be stored upon manufacturing of these devices and systems.

The following detailed description presents various descriptions of specific certain embodiments. However, the innovations described herein can be embodied in a multitude of different ways, for example, as defined and covered by the claims or select examples. In the following description, reference is made to the drawings where like reference numerals can indicate identical or functionally similar elements. It will be understood that elements illustrated in the drawings are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The description may use the phrases "in an embodiment" or "in embodiments," which may each refer to one or more of the same or different embodiments. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner. Various aspects of the illustrative embodiments are described using terms commonly employed by those skilled in the art to convey the substance of their work to others skilled in the art. The terms "substantially," "approximately," "about," etc., may be used to generally refer to being within +/−20% of a target value based on the context of a particular value as described herein or as known in the art. For the purposes of the present disclosure, the phrase "A and/or B" or notation "A/B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A, B, and/or C).

Example Cable Communication System

For purposes of illustrating frequency-segmented power amplification, proposed herein, it might be useful to first understand phenomena that may come into play in communication systems. The following foundational information may be viewed as a basis from which the present disclosure may be properly explained. Such information is offered for purposes of explanation only and, accordingly, should not be construed in any way to limit the broad scope of the present disclosure and its potential applications.

Transmit (TX) signals in both cable and wireless communications systems may be associated with a relatively large Crest Factor (CF), also referred to as a "Peak to Average Power Ratio" (PAPR). When a PA has limited peak power capability, it may perform hard compression or clip the peaks of a TX signal with a high PAPR, which may result in unrecoverable distortion of the signal. Furthermore, efficiency of some types of PAs, e.g., Doherty PAs, decreases when they have to amplify signals with high PAPR.

Crest Factor Reduction (CFR) is a technique developed for wireless communication systems to limit peak excursions in a controlled manner prior to supplying TX signals to a PA, so that the resultant distortion introduced by the PA is minimized and spectrally shaped in some prescribed fashion. Thus, CFR attempts to eliminate, or at least reduce, peak clipping and peak compression which may be imposed by the PA by reducing the peaks in TX signals prior to supplying the signals to the PA. Unfortunately, inventor of the present disclosure realized that CFR techniques developed for wireless communication systems are not easily compatible with cable communication systems due to the presence of a TC component, unique to the cable communication systems.

Transmission of a signal through a cable, e.g., in cable television communications network, presents challenges not found in wireless communication systems. One such challenge relates cable losses, i.e., attenuation applied to the signal due to transmission through a cable. Cable losses are frequency-dependent, i.e., the amount of attenuation due to transmission through a cable depends on the frequency of the signal being transmitted. In other words, a cable can present a load to a PA circuit that exhibits a frequency-dependent signal loss. In particular, transmission through a cable may be associated with little or no attenuation applied to lower-frequency signal components and much greater attenuation applied to higher-frequency system components (i.e., cable losses are smaller at the lower frequencies and larger at the higher frequencies). For example, a cable may exhibit a high frequency roll-off characteristic of about 2 decibels (dB) of signal amplitude reduction per 100 Megahertz (MHz) of frequency, such as at frequencies above about 50 MHz (i.e., a transfer function of a cable may be shaped as a line titled downwards).

One approach to reducing signal loss through the cable is to include a TC component that can apply an "uptilt" frequency modification to a signal that is input into the PA, so that the resulting output signal from the PA is frequency compensated at its destination after being transmitted across the cable. Thus, a TC component, also referred to as a "TC" or, simply, "tilt," is a component typically included in a TX path of cable communication systems to compensate TX signals for cable losses. Because cable losses are frequency-dependent, TC involves amplifying signal components of different frequencies by different amounts. The term "tilt" used in "TC" comes from the fact that TC may be seen as applying an inverse function of the transfer function of a cable, where little or no amplification may be applied by the TC to lower-frequency signal components and greater amplification may be applied to higher-frequency signal components (i.e., a transfer function of TC is a line tilted upwards). An example of a cable communication system with a tilt circuit is shown in FIG. 1.

FIG. 1 illustrates an example cable communication system 100 that includes a signal source 102, an upconverter 104, a TC circuit 106, a PA 108, and a cable 110. The signal source 102 may provide a lower-frequency signal 122 to be transmitted over a cable to the upconverter 104. The upconverter 104, which may include a digital-to-analog converter (DAC), may perform an upconversion of the lower-frequency signal to a higher-frequency signal, which may then be provided to the TC circuit 106. The TC circuit 106 may perform TC (uptilt) to compensate for the cable losses that the TX signal will undergo when it travels through the cable 110. The PA 108 may then amplify the tilt circuit output signal 107 and output an amplified tilt-compensated PA output signal, which may then be transmitted over the cable 110.

FIG. 1 also illustrates an example schematic of a TC 116 provided by the TC circuit 106 in an attempt to compensate for a cable loss, shown in FIG. 1 with an example schematic cable loss 120, which the TX signal undergoes due to transmission through the cable 110. As shown in FIG. 1, the TC 116 may have a high-pass filter (HPF) transition slope of about 20 dB/GHz, substantially opposite the cable loss 120. FIG. 1 further illustrates an example output 109 of the PA 108, which includes the uptilt applied by the TC circuit 106.

Not only did the inventor of the present disclosure realized that CFR techniques developed for wireless communication systems are not easily compatible with cable communication systems due to the presence of the TC component as described above, but the inventor also realized that the TC may actually lend itself to implementing a different approach to addressing the PAPR challenges. Namely, the inventor realized that performing tilt compensation (i.e., providing a pre-emphasis or a modification of a TX signal to allow for cable attenuation over frequency in cable communication systems) results in frequency shaping of the PA input signal (i.e., a signal provided as an input to the PA 108) such that about 50% of the signal power may be in the top 10% of a frequency spectrum (i.e., a band) of the PA input signal, about 42% of the signal power may be in the middle 50% of the frequency spectrum, and the remaining about 8% of the signal power may be in the lower 10% of the frequency spectrum. Such partitioning of PA input signal power may, then, be exploited by implementing a frequency-segmented PA circuit which uses different PAs (i.e., different PA segments, described herein) to provide power amplification for different sub-bands of the PA input signal in order to improve the overall efficiency of the power amplification.

In some embodiments, at least some of the PAs used in different PA segments of a frequency-segmented PA described herein may be more efficient but designed for relatively narrow bands. One example of such a PA is a Doherty amplifier. As is known in the art, Doherty amplifiers are used heavily in wireless communication systems due to their high efficiency. It would be desirable to use such amplifiers in cable communication systems as well but currently this cannot be done because Doherty amplifiers are designed to operate on signals in wireless bands, e.g., on signals above about 500 MHz or signals above about 700 MHz, whereas signals transmitted in cable communication systems may have components in lower frequencies, e.g., signals around 50 or 100 MHz, or even DC components. Therefore, conventional cable communication systems typically use class AB amplifiers to realize the desired power amplification. While a class AB amplifier may have a much lower efficiency than a Doherty amplifier, it may be used to provide power amplification for an entire range of frequencies of a broadband signal, and, importantly, for low-frequency components of such a signal, while a Doherty amplifier works best for a narrower range signals and for signals that do not have low-frequency components. With the frequency-segmented PA circuits described herein, this no longer is an issue. Namely, in some embodiments, a frequency-segmented PA circuit may use one or more Doherty PAs to provide power amplification for one or more higher-frequency (and, due to uptilt, higher power) portions of a PA input signal instead of using a single broadband but inefficient PA such as a class AB amplifier, which may result in a potential significant improvement in efficiency of the power amplification. For example, in some embodiments, segmentation of the PA input signal spectrum into sub-bands, e.g., of about 100 MHz, may allow using Doherty amplifiers to deliver the high- and the mid-band power requirements, while a more conventional cable PA, e.g., a class AB PA, may be used to deliver the power over the lower sub-band(s). The efficiency at the lower sub-bands may be less critical as only a small percentage of signal power is concentrated there (e.g., about 8% of the signal power, as shown with the example above).

It should be noted that various embodiments illustrated in the drawings relate to implementing frequency-segmented PAs in cable communication systems because improvements that may be achieved with frequency segmentation as described herein may have a particularly large impact for such systems. However, frequency segmentation as described herein may also be implemented in and provide significant advantages for wireless communication systems. Namely, inventor of the present disclosure realized that PAPR in some sub-bands of signal to be transmitted wirelessly may be reduced, compared to the PAPR of the entire broadband signal to be transmitted, which may provide significant advantages in terms of driving PAs in such sub-bands more efficiently. For example, the total PAPR (i.e., the PAPR for the entire broadband wireless signal) may be about 12 dB, but for about 100 MHz sub-bands of the broadband signal the PAPR may be only about 9 dB. For every decrease in PAPR, e.g., for every 1 dB drop in PAPR, it is possible to operate a PA (e.g., a Doherty PA) more efficiently, which means that, in order to achieve the same linearity performance of a PA, it may be possible to reduce bias currents, thus reducing the overall power consumption. This may be a significant advantage for wireless communication systems where some wireless communication nodes, e.g., mobile devices or sensor nodes with wireless communication capabilities, may be devices for which power consumption is a crucial design parameter. Thus, descriptions provided herein are equally applicable to wireless communication systems with modifications, compared to the cable system embodiments described, that would be apparent to a person of ordinary skill in the art (e.g., TC may be omitted in a wireless communication system, and, instead of providing the PA output signal to be transmitted over a cable, the PA output signal may be provided to an antenna to be transmitted wirelessly).

Example Cable Communication Systems with a Frequency-Segmented PA and Analog TC

Figure 2:
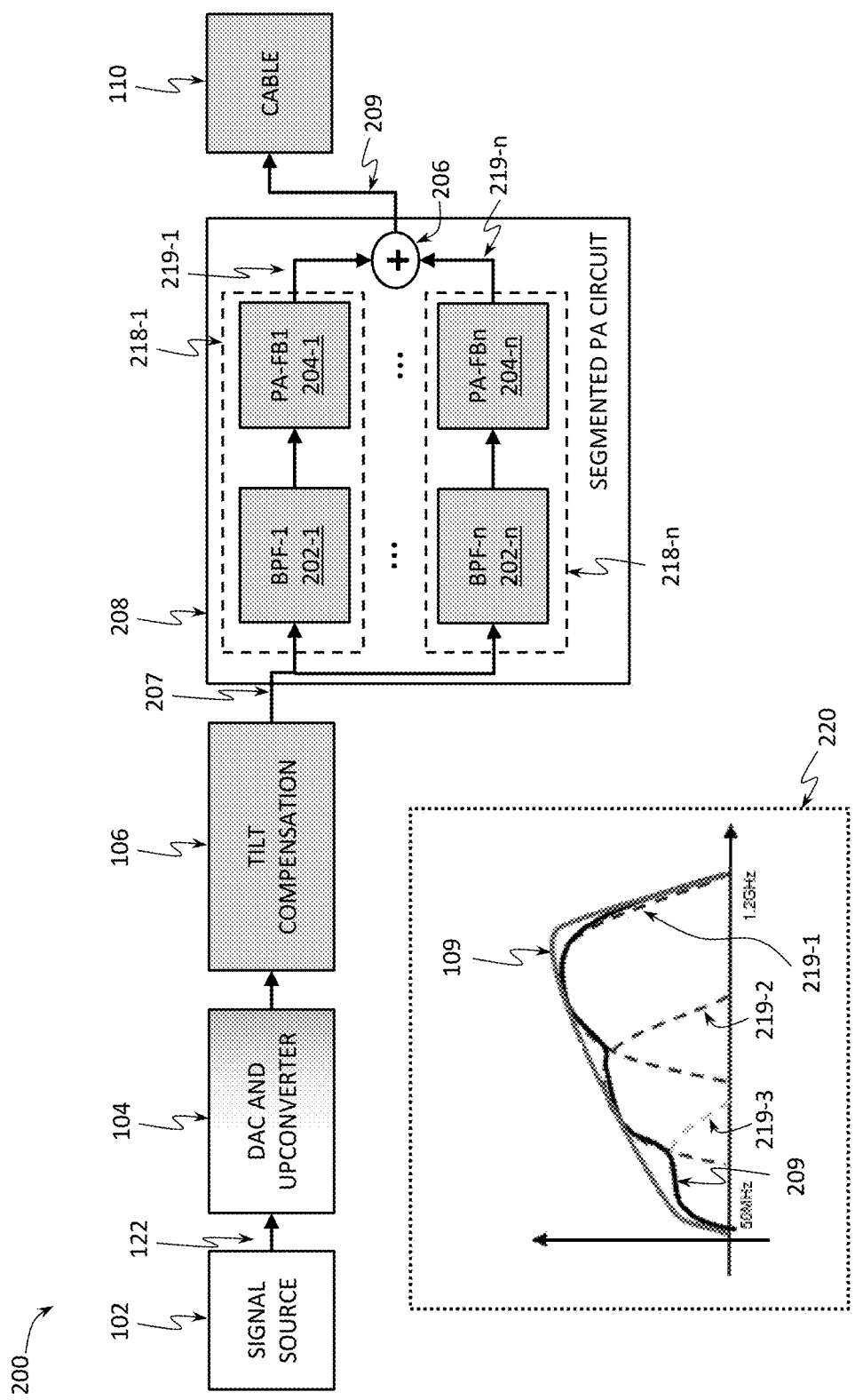
FIG. 2 illustrates a cable communication system with a frequency-segmented PA and an analog tilt compensation (TC) circuit, according to some embodiments of the present disclosure.

FIG. 2 shows an example of a cable communication system 200 with a frequency-segmented PA 208, according to some embodiments of the present disclosure. The system of FIG. 2 is similar to the system 100 of FIG. 1 in that it also includes the signal source 102, the upconverter circuit 104, the TC circuit 106, and the cable 110, as described above. In addition, the system of FIG. 2 illustrates the PA 208, which may be used to implement the PA 108 of the system shown in FIG. 1.

Color coding is used in the illustration of FIG. 2 to indicate components of the cable communication system 200 that operate in a digital domain (shown in FIG. 1 as white blocks; i.e., digital circuits that receive an input of, operate on, and produce an output of digital signals) and components that operate in an analog domain (shown in FIG. 2 as grey blocks; i.e., analog circuits that receive an input of, operate on, and produce an output of analog signals), as well as components that perform conversion from one domain to another (shown in FIG. 2 as a block colored with a transition from white to grey color; e.g., the upconverter 104 shown in FIG. 2 may include a DAC, so that the upconverter 104 may receive a digital signal at its' input but provide an analog signal at its' output).

As shown in FIG. 2, the signal source 102 may be a source of a digital signal, e.g., the digital signal 122, to be transmitted over the cable 110. A signal based on the digital signal output by the signal source 102 may be provided to an input port of the upconverter 104. In some embodiments, the upconverter 104 may be a circuit configured to provide a digital-to-analog conversion of the signal received at the input to the upconverter 104 to generate an analog input signal, and then perform frequency upconversion of the analog signal (i.e., the upconverter 104 may be a "DAC and upconverter" 104). In other embodiments, the upconverter 104 may be configured to perform digital-to-analog conversion combined with upconversion. As used herein, upconversion refers to a frequency mixer performing frequency mixing of an analog version of the signal provided by the signal source 102 and a local oscillator (LO) signal of the communication system 200 to generate an upconverted analog version of the signal provided by the signal source.

In some embodiments, the TC circuit 106 may be an analog frequency modification "uptilt" filter circuit, placed in the TX signal path for the signal output by the signal source 102, before the PA circuit 108. The TC circuit 106 may provide pre-emphasis having a high-pass frequency gain expansion characteristic (e.g., +2 dB/100 MHz amplification for frequencies exceeding about 50 MHz) of a cable to offset or compensate for the low-pass frequency-dependent signal loss of the cable 110. To that end, the TC circuit 106 may be configured to receive as an input a TC input signal, which is a signal based on the signal provided by the signal source 102 (e.g., the TC input signal may be based on the analog version of the signal provided by the signal source, e.g., the analog signal based on the upconverted analog version of the signal provided by the signal source), and apply a TC function to the TC input signal to generate a TC output signal.

As shown in FIG. 2, the PA 208 is a frequency-segmented PA in that it may include a plurality of branches, referred to herein as "PA segments," each of which may be configured to operate on signals in an analog domain, to perform power amplification for portions of a PA input signal in different frequency bands. In particular, FIG. 2 illustrates the PA 208 having n PA segments, where n may be an integer greater than 1. As shown in FIG. 2, a PA input signal 207, received at an input to the PA 208, may be provided to a first PA segment 218-1. The first PA segment 218-1 is configured to amplify a portion of the PA input signal 207 in a first frequency band to generate a PA segment output signal 219-1 having frequency components in the first frequency band, but amplified, compared to the PA input signal 207. The PA input signal 207 is also provided to a second PA segment 218-2 (illustrated in FIG. 2 with the PA input signal 207 being provided to an nth PA segment 218-$n$, which could be the second PA segment 218-$n$ in case n=2). The second PA segment 218-2 is configured to amplify a portion of the PA input signal 207 in a second frequency band to generate a PA segment output signal 219-2 having frequency components in the second frequency band, but amplified, compared to the PA input signal 207. This may be repeated for any n number of two or more PA segments, as schematically indicated in FIG. 2 with multiple dots between the PA segment 218-1 and the PA segment 218-$n$. The frequency bands which different PA segments 218 are configured to provide power amplification for may differ in at least some frequencies. Typically, most of the frequencies of the different PA segments 218 would be unique to a given PA segment 218, but the different frequency bands of these PA segments may overlap at one or both ends of the bands. For example, in some embodiments of the PA 208, a first PA segment 218-1 may provide power amplification for components of the PA input signal 207 having frequencies in a band between 800 MHz and 1.2 GHz, a second PA segment 218-2 may provide power amplification for components of the PA input signal 207 having frequencies in a band between 400 MHz and 800 MHz, while a third PA segment 218-3 may provide power amplification for components of the PA input signal 207 having frequencies in a band between 50 MHz and 400 MHz. As also shown in FIG. 2, is that the PA segment output signals 219-1 through 219-$n$ may be provided to a combiner 206, e.g., an adder, which may combine, e.g., add, all of the PA segment output signals 219 to generate a PA output signal 209. The PA output signal 209 may then be provided for transmission over the cable 110.

FIG. 2 illustrates that, in some embodiments, each of the PA segments 218 may include a respective band-pass filter (BPF) 202, shown in FIG. 2 as a BPF 202-1 for the PA segment 218-1 and as a BPF 202-$n$ for the PA segment 218-$n$, configured to perform frequency filtering of the PA input signal 207 to reduce or eliminate frequency components of the PA input signal 207 outside of the frequency band (FB) of a given PA segment 218 (i.e., so that a given PA segment 218 may perform power amplification in its associated FB). FIG. 2 further illustrates that, in some embodiments, each of the PA segments 218 may also include a respective PA 204, shown in FIG. 2 as a PA-FB1 204-1 for the PA segment 218-1 (PA-FB1 configured to perform power amplification for a portion of the PA input signal 207 in a first frequency band FB1) and as a PA-FBn 204-n for the PA segment 218-n (PA-FBn configured to perform power amplification for a portion of the PA input signal 207 in an nth frequency band FB1). In some embodiments, the BPF and the PA-FB in each of the PA segments 218 may be implemented as separate circuits, in some of which embodiments, the BPF may be configured to provide some amplification in addition to frequency filtering. In other embodiments, the BPF and the PA-FB in each of the PA segments 218 may be implemented as a single circuit configured to perform frequency filtering and amplification of a respective portion of the PA input signal 207 to generate a respective PA segment output signal 219.

Since the system 200 is a cable communication system that includes the TC circuit 106, the PA input signal 207 is a signal based on the TC output signal provided at an output of the TC circuit 106. In turn, the TC output signal is based on the upconverted signal provided at an output of the upconverter 104 (which signal may be an analog signal), which is based on the digital signal provided at an output of the signal source 102. Thus, the TC circuit 106 may be configured to receive a TC input signal which may be an analog signal based on an analog version of the signal provided by the signal source 102 (where the analog version may be generated by the DAC of the upconverter 104 based on the digital version of the signal provided by the signal source 102), and to apply a TC for the TC input signal to generate a TC output signal, which may then be provided to the frequency-segmented PA 208.

If the system 200 is to be modified to be a wireless communication system, then the PA input signal 207 would be a signal based on an upconverted output signal provided at an output of the upconverter 104, the TC circuit 106 would be omitted, and the cable 110 would be replaced with an antenna configured to wirelessly transmit an RF signal based on the PA output signal 209.

An inset 220 (an illustration within a dotted contour) provided at the bottom of FIG. 2 provides an illustration of a frequency spectrum of an example desired PA output 109 (e.g., the same as the PA output 109 shown in FIG. 1), which illustrates the tilt, and an example frequency spectrum for an actual output from the frequency-segmented PA 208 (i.e., the PA output 209) for a case where the segmented PA 208 includes 3 PA segments 218. Frequency spectrum for each of the outputs of the respective PA segments 218-1, 218-2, and 218-3 is shown in that illustration as a frequency spectrum for PA segment output signals 219-1, 219-2, and 219-3, respectively. The PA output signal 209 may then be a sum of the PA segment output signals 219-1, 219-2, and 219-3. For example, the first PA segment 218-1 may provide power amplification for components of the PA input signal 207 having frequencies in a band between 800 MHz and 1.2 GHz, the second PA segment 218-2 may provide power amplification for components of the PA input signal 207 having frequencies in a band between 400 MHz and 800 MHz, while the third PA segment 218-3 may provide power amplification for components of the PA input signal 207 having frequencies in a band between 50 MHz and 400 MHz. These frequency bands may be referred to, respectively, as high-band, mid-band, and low-band. In some embodiments, a first PA such as a Doherty amplifier may be used to implement the PA-FB1 (i.e., the PA 204-1 for the high-band PA segment 218-1), a second PA such as another Doherty amplifier may be used to implement the PA-FB2 (i.e., the PA 204-2 for the mid-band PA segment 218-2), and a third PA such as a class AB amplifier may be used to implement the PA-FB3 (i.e., the PA 204-3 for the low-band PA segment 218-3). The inset 220 illustrates that, as a result of frequency segmentation in the PA 208, the tilt profile in the PA output 209 may not be quite as that required in order to optimize compensation for cable losses due to the transmission through the cable 110 (i.e., the PA output signal 209 is not the same as the desired PA output 109, as shown in the inset 220). In some implementations, this deviation may be acceptable. In other implementations, further means may be provided in an attempt to compensate for (e.g., reduce or eliminate) the deviation, e.g., using a digital equalizer circuit as described below.

Figure 3A:
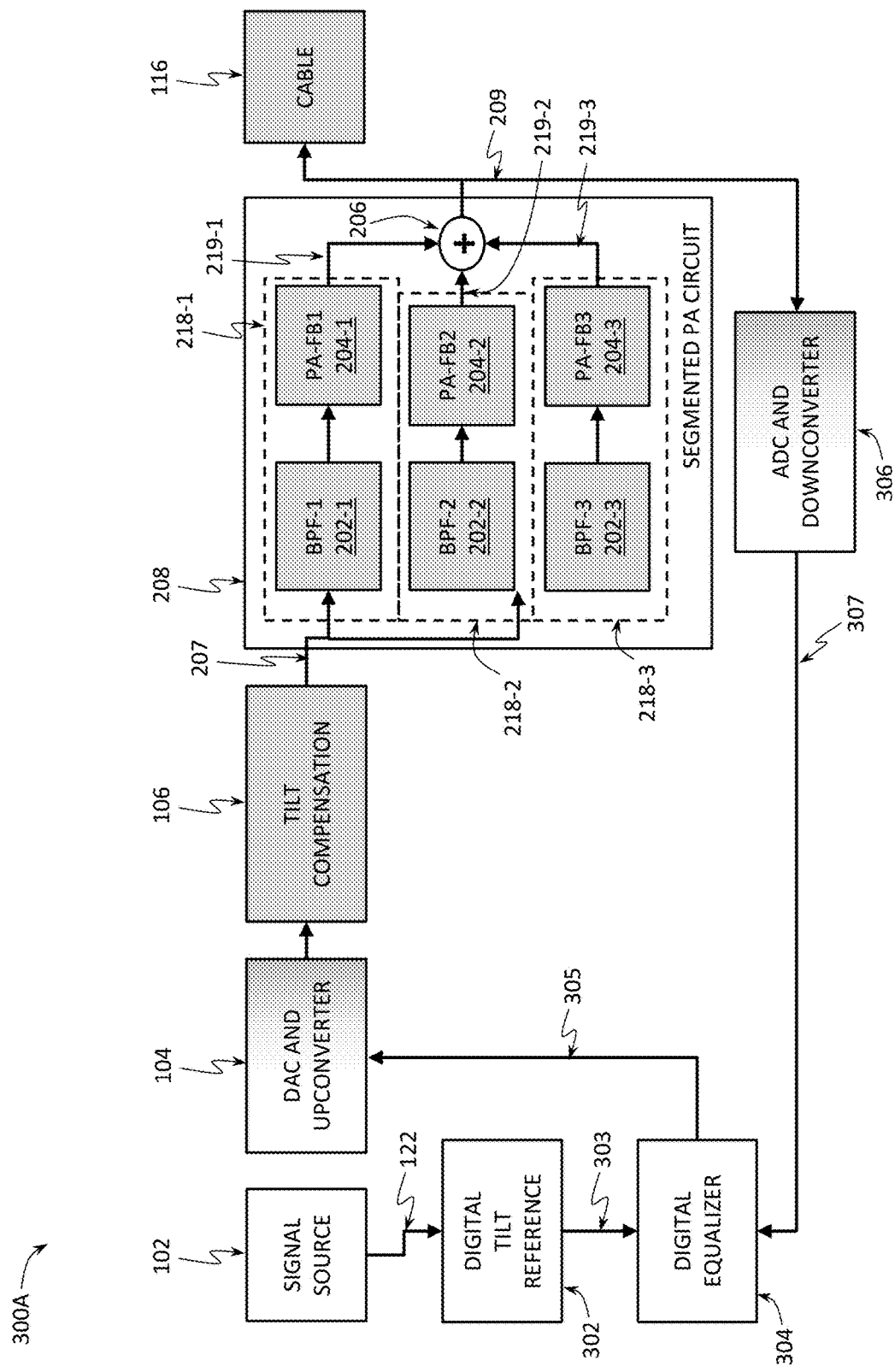
FIG. 3A illustrates a cable communication system with a frequency-segmented PA, an analog TC circuit, and a digital equalizer circuit, according to some embodiments of the present disclosure.

FIG. 3A shows an example of a cable communication system 300A with a frequency-segmented PA, an analog TC, and a digital equalizer circuit, according to some embodiments of the present disclosure. The system of FIG. 3A is similar to the system 200 of FIG. 2 in that it also includes the signal source 102, the upconverter circuit 104, the TC circuit 106 configured to implement an analog tilt, the cable 110, and the frequency-segmented PA 208, as described above. In addition, the system of FIG. 3A further illustrates a digital equalizer circuit 304, as well as a digital tilt reference circuit 302 and an analog-to-digital converter (ADC) and downconverter circuit 306. Color coding used in the illustration of FIG. 2 to indicate components that operate in a digital domain (i.e., white blocks), components that operate in an analog domain (i.e., grey blocks), and components that perform conversion from one domain to another (i.e., blocks colored with a transition from white to grey color) is also used in FIG. 3A. Thus, for the embodiment of the cable communication system 300A, each of the digital tilt reference circuit 302 and the digital equalizer circuit 304 may be a digital circuit, while the TC circuit 106 and the PA 208 may be analog circuits, with the upconverter 104 performing conversion from the digital to the analog domain and the downconverter 306 performing conversion from the analog to the digital domain. Thus, in contrast to FIG. 2, in FIG. 3A, a frequency-selective tilt reference circuit 302 (which may also be referred to as a "reference uptilt") and a tilt equalizer circuit 304 has been included in the TX signal path, while a downconverter 306 has been included in the feedback path (i.e., providing feedback from the output of the PA 208 to the input of the TC circuit 106 and the PA 208).

As shown in FIG. 3A, the tilt reference circuit 302 may be included in the signal path before the digital equalizer circuit 304. For example, the tilt reference circuit 302 may have an input coupled to an output of the signal source 102, so that it may receive the TX signal, e.g., the digital signal 122, from the signal source 102, and may have an output coupled to an input of the digital equalizer circuit 304, so that the output generated by the tilt reference circuit 302 may be provided to the digital equalizer circuit 304. Similar to the TC circuit 106, the tilt reference circuit 302 can provide a high-pass frequency gain expansion characteristic (e.g., +2 dB/100 MHz amplification for frequencies exceeding about 50 MHz) of a cable offset or compensate for the low-pass frequency-dependent signal loss of the cable 110. In some embodiments, the tilt reference circuit 302 may be a digital tilt reference circuit 302.

In various embodiments, the tilt reference circuit 302 may be at least partially pre-programmed and/or at least partially trained to generate appropriate output 303 (i.e., the pre-tilted input signal that will be further processed by the digital equalizer circuit 304) by applying to the input signal (e.g., the digital signal provided by the signal source 102, or a signal based thereon) a frequency response selected to emulate a frequency response of the TC circuit 106, possibly with the desired power amplification as is desired to receive at an output of the PA 208. To that end, in some embodiments, the tilt reference circuit 302 may be implemented as a digital filter that could be designed based on, e.g., lab characterization and/or factory calibration of the desired tilt. For example, in some embodiments, pre-programming or training the tilt reference circuit 302 may include using suitable instrumentation to stimulate the tilt fixture, extract the response, and fit a model to the input—output relationship. In some embodiments, such a model may be fitted online, using the actual transmitter to stimulate the tilt fixture and an observation receiver to extract the response; afterwards, a fit of the model (e.g., a software fit) may be performed offline. In various embodiments, the tilt reference circuit 302 may include any means for providing an indication to the digital equalizer circuit 304 as to how a desired output of the TC circuit 106 or the desired output of the PA 208 should look like.

As also shown in FIG. 3A, the digital equalizer circuit 304 may be included in the signal path after the tilt reference circuit 302. For example, the digital equalizer circuit 304 may have an input coupled to an output of the tilt reference circuit 302, so that it may receive the output signal generated by the tilt reference circuit 302, and may have an output coupled to an input of the upconverter 104, so that the output generated by the digital equalizer circuit 304 may be upconverted by the upconverter 104. As further illustrated in FIG. 3A, the digital equalizer circuit 304 is further configured to receive a second input signal, namely, an input signal 307 shown in FIG. 3A, the signal 307 indicative of the PA output signal 209, possibly after the PA output signal 209 has been converted from analog to digital domain and downconverted in frequency by the downconverter 306. Thus, the digital equalizer circuit 304 may be configured to generate an equalized output signal 305 based on the pre-tilted input signal 303 and further based on the PA output signal 209 (e.g., on the downconverted digital version 307 of the PA output signal 209). In turn, the TC input signal received by the TC circuit 106 is then based on the equalized output signal 305 generated by the digital equalizer circuit 304 (e.g., the TC input signal may be an analog signal based on the upconverted analog version of the equalized output signal 307, e.g., the upconverted analog signal generated by the upconverter 104 based on the equalized output signal 305 generated by the digital equalizer circuit 304).

In general, the digital equalizer circuit 304 may be configured to match the input 307 provided from the downconverter 306 to the input 303 provided from the tilt reference circuit 302. More specifically, the digital equalizer circuit 304 may be configured to generate such an output signal (i.e., the equalized output signal 305) so that the input 307 provided from the downconverter 306 is as close to the input 303 provided from the tilt reference circuit 302 as possible. For example, in some embodiments, the digital equalizer circuit 304 may be configured to generate the equalized output signal 305 such that, when the TC input signal received by the TC circuit 106 is based on the equalized output signal 305 (e.g., the TC input signal is an analog upconverted version of the equalized output signal 305), a deviation of the PA output signal 209 (e.g., of the digital downconverted signal 307) from the pre-tilted input signal 303 satisfies one or more criteria. Thus, the digital equalizer circuit 304 is configured to receive two digital signals as inputs. One input is the pre-tilted input signal 303 generated by the digital tilt reference circuit 302, which signal indicates to the digital equalizer circuit 304 how the signal provided by the signal source should look like after it has been tilted by the TC circuit 106 and, possibly, after it has been amplified by the PA after the TC circuit 106. The other input to the digital equalizer circuit 304 is indicative of the PA output signal 209 that was actually generated by the segmented PA circuit 208 based on an output of the TC circuit 106. As described, e.g., with reference to the inset 220 shown in FIG. 2, in general, the actual PA output signal 209 may differ from the desired PA output signal 109 because of the segmentation in the PA 208 (i.e., separate amplification of different frequency bands of the PA input signal 207 and then combination of the amplified portions). In such a situation, the digital equalizer circuit 304 may be configured to attempt to generate such an output signal (i.e., the signal referred to herein as the "equalized output signal 305") that, when this signal is used to generate the TC input signal, the PA output signal 209 resembles the desired PA output signal 109 closer than it has before. In other words, the digital equalizer circuit 304 circuit may be configured to attempt to generate such an output signal 305 that minimizes, or at least reduces, the deviation of the actual PA output signal 209 from the desired PA output signal 109 (the latter based on the pre-tilted input signal 303). For example, in some embodiments, the digital equalizer circuit 304 circuit may be configured to attempt to generate the equalized output signal 305 such that, when the TC input signal received by the TC circuit 106 is based on the equalized output signal 305, a deviation of the actual PA output signal 209 from a desired PA output signal (e.g., the PA output signal 109) based on the pre-tilted input signal 303 is below a certain deviation function. For example, in some embodiments, such as deviation function may define threshold deviation values, e.g., in terms of percentage of deviation or in terms of absolute values of deviation, for different frequency components of the desired PA output signal 109 and the actual PA output signal 209.

In some embodiments, each of the tilt reference circuit 302 and the digital equalizer circuit 304 may be a digital circuit (i.e., a circuit that receives an input of, operates on, and produces an output of digital signals), and the TC circuit 106 may be an analog circuit (i.e., a circuit that receives an input of, operates on, and produces an output of analog signals). The downconverter 306 may include an ADC, configured to convert the PA output signal 209 from an analog version to a digital version, and a frequency downconverter configured to perform frequency mixing of the PA output signal 209 with a LO signal, prior to providing the digital downconverted signal 307 indicative of the PA output signal 209 to the digital equalizer circuit 304 (i.e., the digital equalizer circuit 304 is configured to generate the equalized output signal 305 based on the digital pre-tilted input signal 303 and further based on the digital version 307 of the PA output signal 209). In some embodiments, the tilt equalizer circuit 304 may be at least partially pre-programmed and/or at least partially trained to generate the equalized output signal 305 as described above (i.e., the equalized output signal, a version of which will eventually be amplified by the PA circuit 208).

Figure 3B:
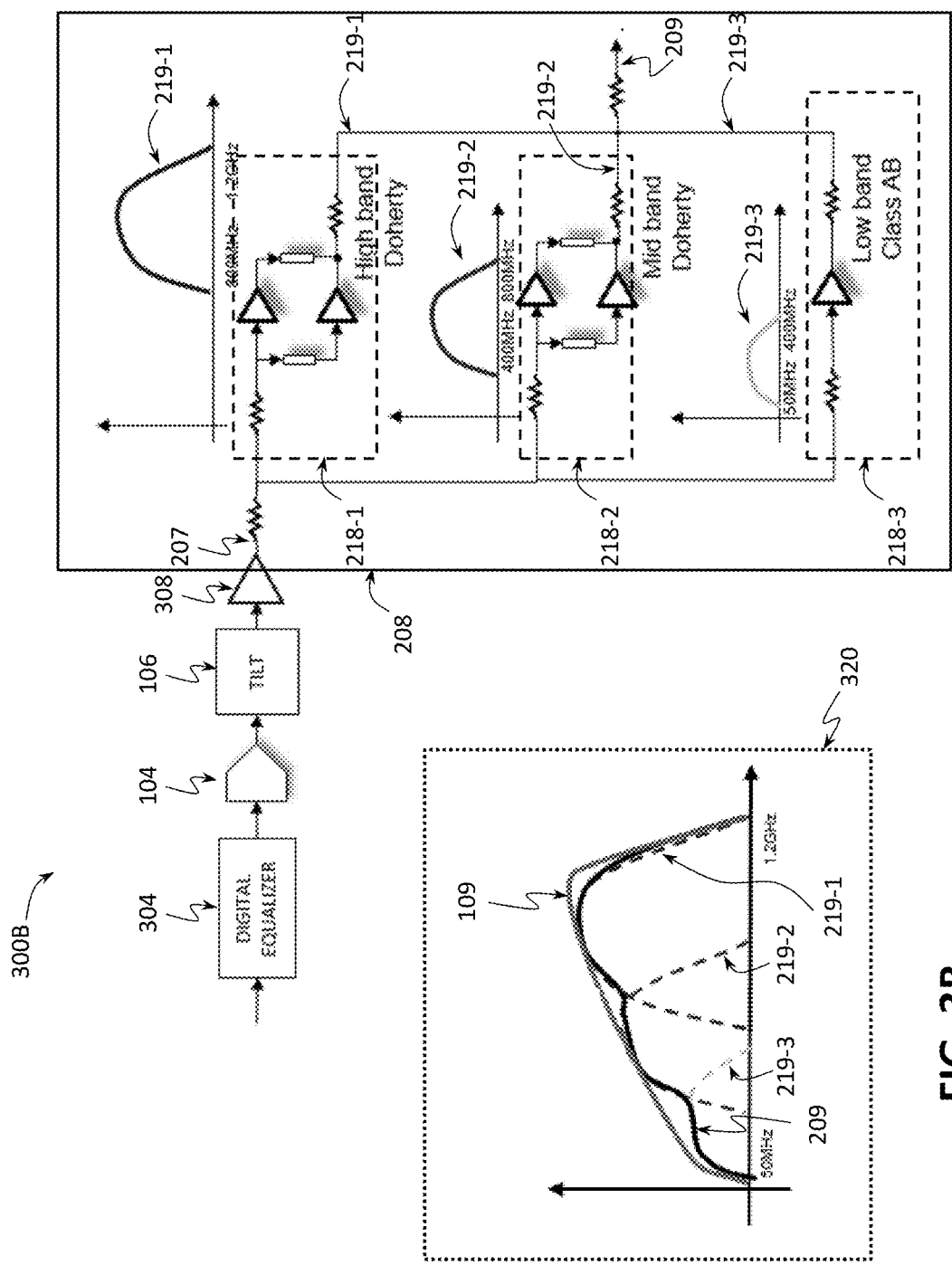
FIG. 3B illustrates a portion of an example implementation of the cable communication system of FIG. 3A, according to some embodiments of the present disclosure.

FIG. 3B illustrates a portion 300B of one example implementation of the cable communication system 300A of FIG. 3A, according to some embodiments of the present disclosure. Elements shown in FIG. 3B using the reference numerals of the previous figures are intended to illustrate the same or analogous elements, so that, in the interests of brevity, their description is not repeated again. FIG. 3B further illustrates that, in some embodiments, the high- and mid-band PA segments may be implemented using respective Doherty amplifiers (e.g., using a high-band Doherty amplifier for the first frequency band between 800 MHz and 1.2 GHz to produce the first PA segment output 219-1, a spectrum of which is illustrated in FIG. 3B above the first PA segment 218-1, and using a mid-band Doherty amplifier for the second frequency band between 400 MHz and 800 MHz to produce the second PA segment output 219-2, a spectrum of which is illustrated in FIG. 3B above the second PA segment 218-2), while the low-band PA segment may be implemented using a class AB amplifier (e.g., using a class AB amplifier for the third frequency band between 50 MHz and 400 MHz to produce the third PA segment output 219-3, a spectrum of which is illustrated in FIG. 3B above the third PA segment 218-3). Similar to the inset 220 shown in FIG. 2, an inset 320 shown at the bottom left portion of FIG. 3B illustrates that, as a result of frequency segmentation in the PA 208, the tilt profile in the PA output 209 may not be quite as that required in order to optimize compensation for cable losses due to the transmission through the cable 110 (i.e., the PA output signal 209 is not the same as the desired PA output 109, as shown in the inset 220). The digital equalizer circuit 304 may then be configured to reduce, minimize, or eliminate the deviation between the actual PA output 209 and the desired PA output 109.

It should be noted that the illustration of FIG. 3B does not explicitly show BPFs 202 in different PA segments 218, as were shown in the illustration of FIG. 3A. This is to illustrate that, in some embodiments, BPFs 202 may be built in to the amplifiers 204 included in the PA segments 218. The digital equalizer circuit 304 is configured to equalize, or compensate, for the band-pass filtering that has to be performed in the PA 208 as a part of performing power amplifications using different PAs for different frequency bands. In reality, it may be practically impossible to implement frequency segmentation in the PA 208 without impairing the tilt response applied by the TC circuit 106, so the digital equalizer circuit 304 is configured to try to correct the tilt impairments introduced by the segmented PA circuit 208.

The illustration of FIG. 3B further shows a pre-amplifier 308 (which may be considered to be a part of the frequency-segmented PA circuit 208), configured to provide pre-amplification of the TC output signal to generate the PA input signal 207. Inclusion of such a pre-amplifier 308 in some embodiments may, e.g., be advantageous in terms of distributing the gain and noise in an efficient manner along the Tx line-up.

Figure 4A:
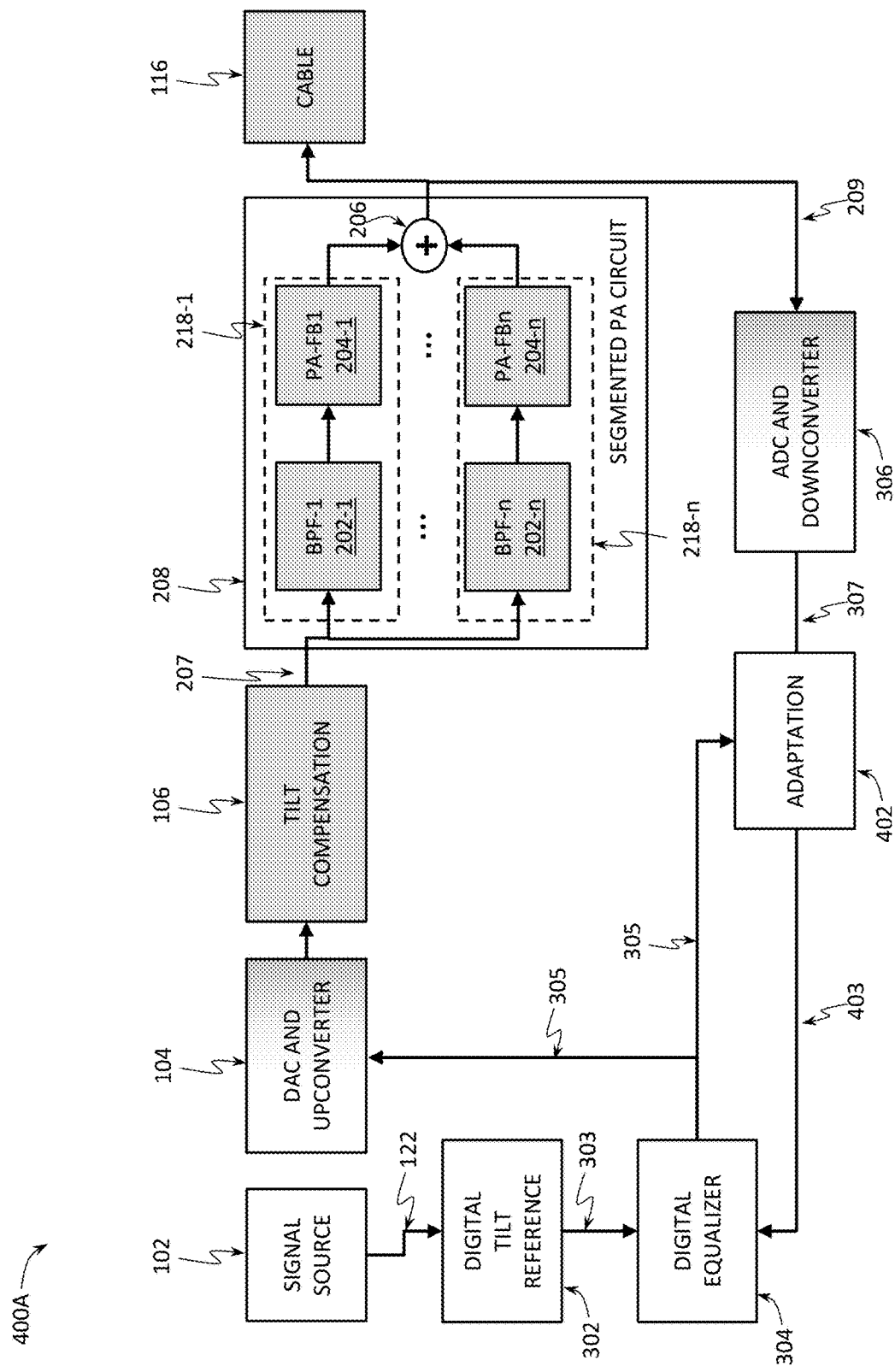
FIG. 4A illustrates a cable communication system with a frequency-segmented PA, an analog TC circuit, a digital equalizer circuit, and a digital adaptation circuit, according to some embodiments of the present disclosure.

FIG. 4A illustrates a cable communication system 400A with a frequency-segmented PA, an analog TC, a digital equalizer circuit, and a digital adaptation circuit, according to some embodiments of the present disclosure. The system of FIG. 4A is similar to the system 300 of FIG. 3 in that it also includes the signal source 102, the upconverter circuit 104, the TC circuit 106 configured to implement an analog tilt, the cable 110, the frequency-segmented PA 208, the digital tilt reference circuit 302, the digital equalizer circuit 304, and the ADC and downconverter circuit 306 as described above. In addition, the system of FIG. 4A further illustrates an adaptation circuit 402. Color coding used in the illustration of FIGS. 2 and 3A is maintained in FIG. 4A. Thus, for the embodiment of the cable communication system 400A, each of the digital tilt reference circuit 302, the digital equalizer circuit 304, and the adaptation circuit 402 may be a digital circuit, while the TC circuit 106 and the PA 208 may be analog circuits, with the upconverter 104 performing conversion from the digital to the analog domain and the downconverter 306 performing conversion from the analog to the digital domain. Thus, in contrast to FIG. 3A, in FIG. 4A, an adaptation circuit 402 has been included in the feedback path (i.e., providing feedback from the output of the PA 208 to the input of the TC circuit 106 and the PA 208, via the downconverter 306).

As shown in FIG. 4A, in the cable communication system 400A, similar to the embodiment of FIG. 3A, the tilt reference circuit 302 may still be at least partially pre-programmed and/or at least partially trained to generate an appropriate pre-tilted output 303, which is then provided to the digital equalizer circuit 304. In contrast to the embodiment of FIG. 3A, the equalized output signal 305 generated by the digital equalizer circuit 304 is not only provided to the DAC and upconverter circuit 104, but also to the adaptation circuit 402. As further shown in FIG. 4A, a second input to the adaptation circuit 402 is the downconverted digital version 307 of the PA output signal 209, generated by the ADC and downconverter circuit 306. The adaptation circuit 402 is then configured to generate an adaptation circuit output signal 403 based on the equalized output signal 305 and the downconverted digital version 307 of the PA output signal 209, where a signal indicative of the adaptation circuit output signal 403 is then provided back to the digital equalizer circuit 304. In particular, the adaptation circuit 402 may be used to train the digital equalizer circuit 304 to perform compensation for the tilt profile impaired by the frequency segmentation in the PA circuit 208. In some embodiments, the adaptation circuit 402 may be considered to be a part of the digital equalizer circuit 304.

Figure 4B:
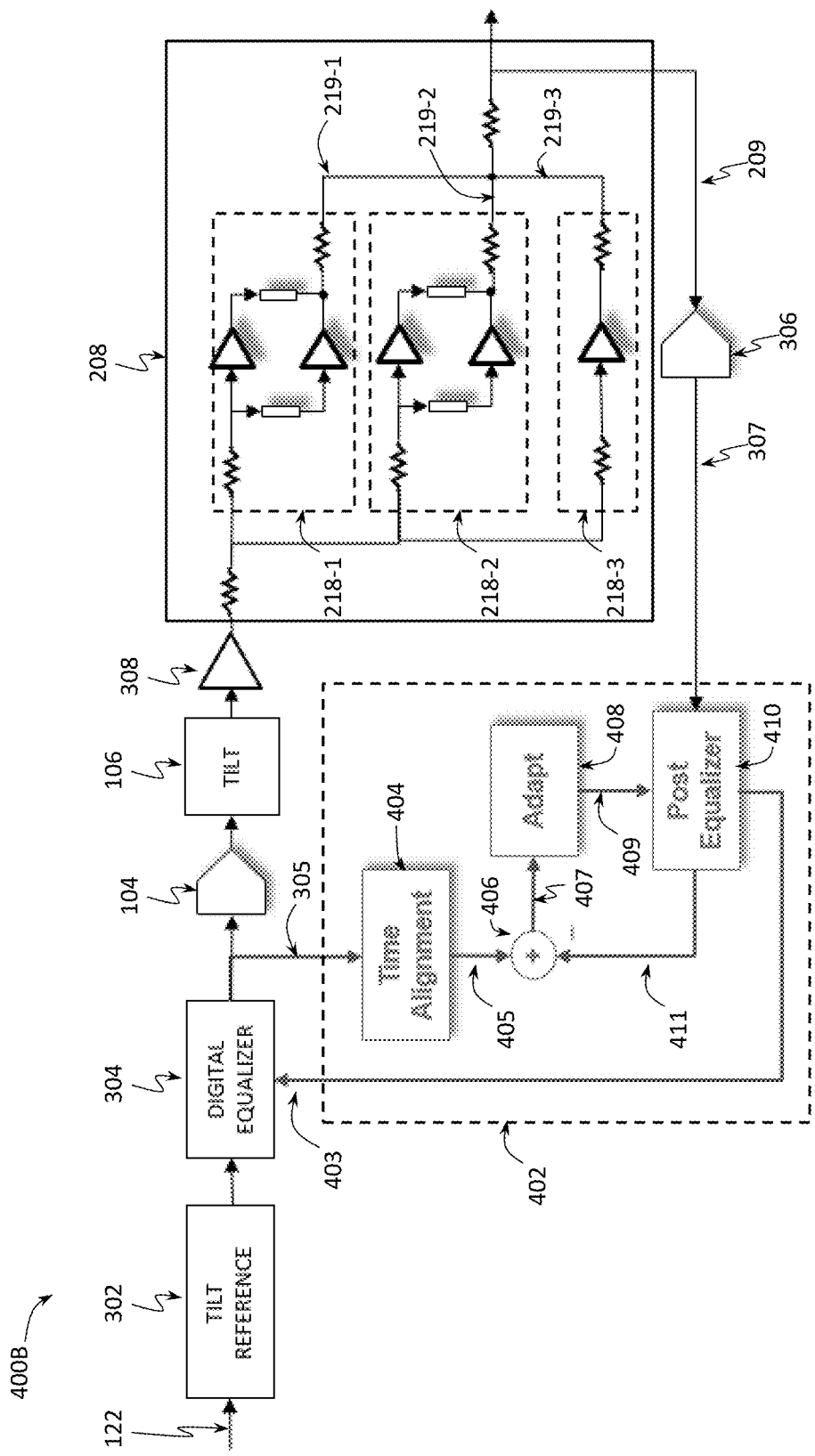
FIG. 4B illustrates a portion of an example implementation of the cable communication system of FIG. 4A, according to some embodiments of the present disclosure.

FIG. 4B illustrates a portion 400B of an example implementation of the cable communication system 400A of FIG. 4A, according to some embodiments of the present disclosure. Elements shown in FIG. 4B using the reference numerals of the previous figures are intended to illustrate the same or analogous elements, so that, in the interests of brevity, their description is not repeated again. FIG. 4B further illustrates details of the adaptation circuit 402, according to some embodiments of the disclosure. As shown in FIG. 4B, in some embodiments, the adaptation circuit 402 may be implemented using a time alignment circuit 404, a combiner 406, an adaptation algorithm 408, and a post equalizer circuit 410. The time alignment circuit 404 may be configured to time-align the equalized output signal 305 to a post equalized output signal 411, thus generating a time-aligned adaptation circuit output signal 405, so that the combiner 406 can subtract the post equalized output signal 411 from the time-aligned adaptation circuit output signal 405 to generate a difference signal 407. The difference signal 407 may be provided to the adaptation algorithm 408 which may be configured to generate an adaptation signal 409 based on the difference signal 407. The adaptation signal 409 may provide an indication to the post equalizer 410 as to how the post equalized output signal 411 should be like in order to reduce, minimize or eliminate the differences between the actual PA output signal 209 and the desired PA output signal 109. The post equalizer 410 may be configured to generate the post equalized output signal 411 based on two inputs thereto: the adaptation signal 409 and the digital version 307 of the PA output signal 209. The post equalized output signal 411 may also be provided to the digital equalizer circuit 304 as the adaptation circuit output signal 403. The adaptation circuit 402 as shown in FIG. 4B is just one of many possibilities of an adaptive signal processing algorithm that may be implemented to enable the digital equalizer circuit 304 to compare outputs in the forward and in the feedback paths (i.e., to compare the digital pre-tilted input signal 303 received by the digital equalizer circuit 304 in the forward path with the adaptation circuit output signal 403 received by the digital equalizer circuit 304 in the feedback path) and try to minimize their difference. Other implementations of how the digital equalizer circuit 304 may be trained in accordance with embodiments described herein are also within the scope of the present disclosure.

Figure 5A:
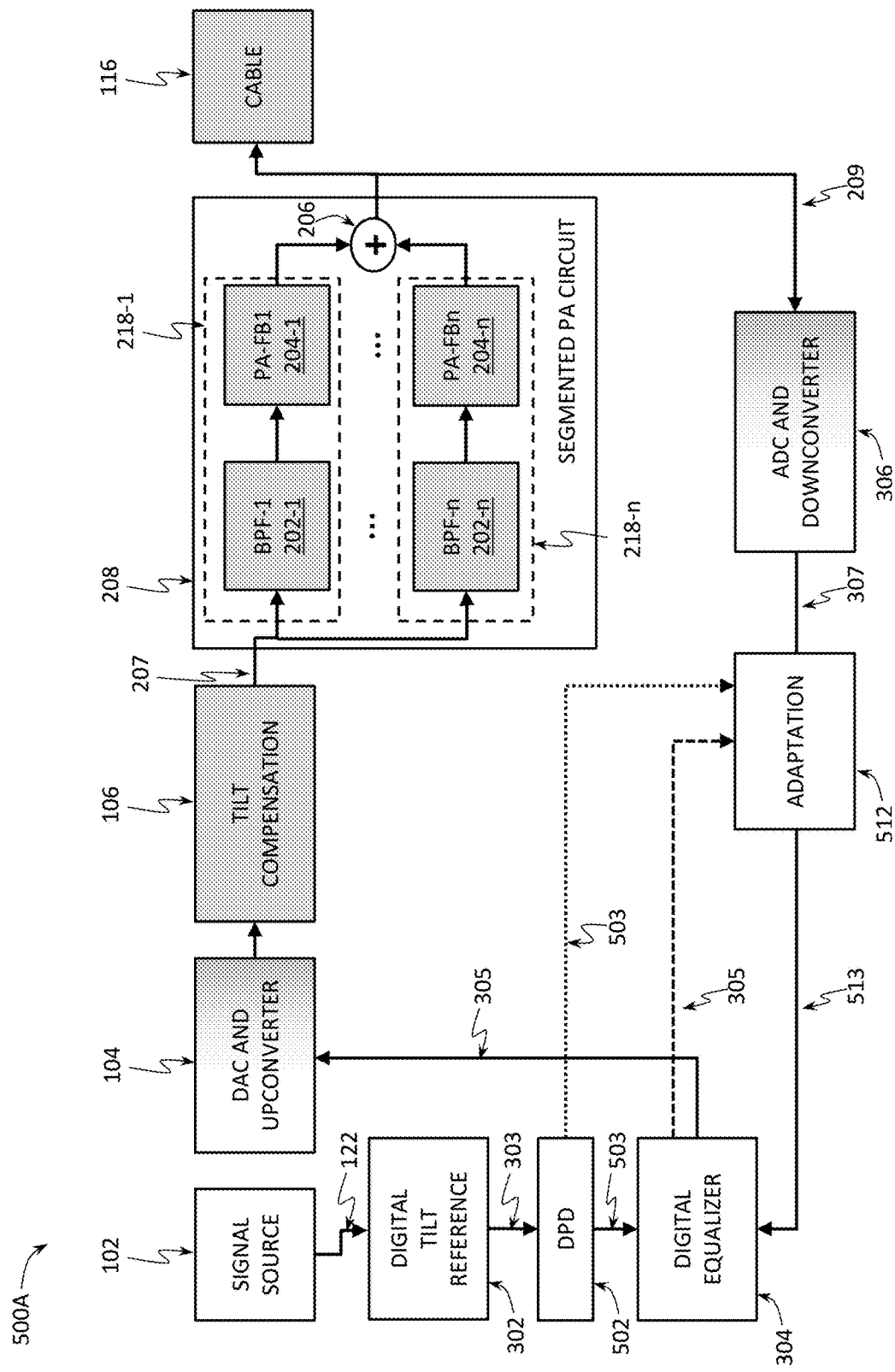
FIG. 5A illustrates a cable communication system with a frequency-segmented PA, an analog TC circuit, a digital equalizer circuit, a digital adaptation circuit, and a digital predistortion (DPD) circuit, according to some embodiments of the present disclosure.

The present inventor further recognized that allowing the frequency-segmented PA circuit 208 to operate including in its nonlinear (e.g., gain compression) region can provide one or more benefits, such as to improve amplifier efficiency and performance, reduce power consumption, reduce waste heat generation, and reduce or avoid the need for active or passive cooling of the PA circuit, but that using the PA circuit with wideband and large PAPR input signals may present additional challenges that can increase distortion in a PA circuit. To address at least some of these challenges, in some embodiments, a predistortion circuit can be placed in the signal path before the PA circuit 208 for compensating, at least partially, potential nonlinear behavior of the PA circuit 208. For example, a DPD circuit 502 can be placed as shown in FIG. 5A. A cable communication system 500A shown in FIG. 5A is similar to the system 400A of FIG. 4A in that it also includes the signal source 102, the upconverter circuit 104, the TC circuit 106 configured to implement an analog tilt, the cable 110, the frequency-segmented PA 208, the digital tilt reference circuit 302, the digital equalizer circuit 304, and the ADC and downconverter circuit 306, as described above. In addition, the system 500A further includes the DPD circuit 502 between the digital tilt reference circuit 302 and the digital equalizer circuit 304, and also includes an adaptation circuit 512. Color coding used in the illustration of FIGS. 2, 3A, and 4A is maintained in FIG. 5A. Thus, for the embodiment of the cable communication system 500A, each of the digital tilt reference circuit 302, the digital equalizer circuit 304, the adaptation circuit 512, and the DPD circuit 502 may be a digital circuit, while the TC circuit 106 and the PA 208 may be analog circuits, with the upconverter 104 performing conversion from the digital to the analog domain and the downconverter 306 performing conversion from the analog to the digital domain.

The DPD circuit 502 is configured to implement any of suitable DPD algorithms to pre-emptively correct, in the digital domain, for distortions due to the nonlinearity of the PA 208 (which, essentially, shapes the data before it gets to the PA 208 to counteract the nonlinearity distortions the PA 208 will produce). The DPD circuit 502 may be configured to apply any such DPD algorithms to the pre-tilted output 303 to generate a digitally predistorted output signal 503. A further processed version of the digitally predistorted output signal 503 will then, eventually, be provided to the TC circuit 106. For example, in some embodiments, as shown in FIG. 5A, the digitally predistorted output signal 503 may be provided to the digital equalizer circuit 304 which will process the digitally predistorted output signal 503 in substantially the same manner as described above for the digital equalizer circuit 304 processing the pre-tilted output 303, and produce the equalized output signal 305. The second input to the digital equalizer circuit 304 in the embodiment of FIG. 5A may be an adaptation circuit output signal 513 generated by the adaptation circuit 512. The adaptation circuit 512 may be configured to operate as described with reference to the adaptation circuit 402, except that, as shown in FIG. 5A, in addition to receiving the equalized output signal 305 and the downconverted digital version 307 of the PA output signal 209 as inputs, the adaptation circuit 512 may be configured to also receive the digitally predistorted output signal 503, as a third input. The adaptation circuit 512 may then be configured to generate the adaptation circuit output signal 513 based on the equalized output signal 305, the downconverted digital version 307 of the PA output signal 209, and the digitally predistorted output signal 503.

Since the nonlinear behavior, e.g., nonlinear gain compression, of the PA circuit 208 may vary over time and operating conditions, the feedback loop provided by the ADC and converter 306 and the adaptation circuit 512 may be used to monitor an output of the PA circuit 208. When such a feedback loop is implemented, information monitored at the output of the PA circuit 208 (i.e., the PA output signal 209) could be fed back to the digital equalizer circuit 304 to modify or vary the predistortion applied by the DPD circuit 502. In other embodiments, the cable communication system 500A could be implemented without the feedback loop (i.e., without the adaptation circuit output signal 513 being provided to the digital equalizer circuit 304 as an input).

Figure 5B:
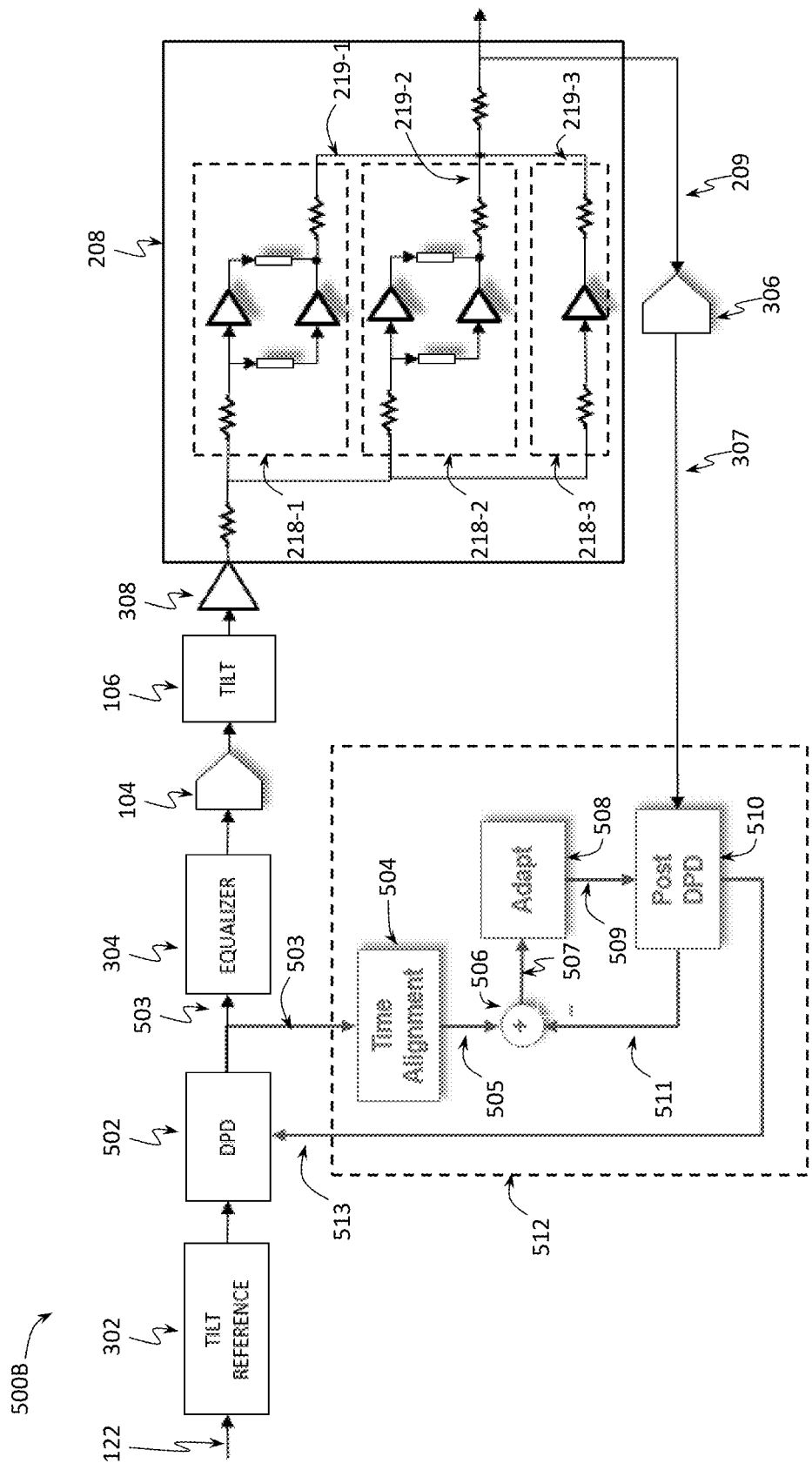
FIG. 5B illustrates a portion of an example implementation of the cable communication system of FIG. 5A, according to some embodiments of the present disclosure.

FIG. 5B illustrates a portion 500B of an example implementation of the cable communication system 500A of FIG. 5A, according to some embodiments of the present disclosure. Elements shown in FIG. 5B using the reference numerals of the previous figures are intended to illustrate the same or analogous elements, so that, in the interests of brevity, their description is not repeated again. FIG. 5B further illustrates details of the adaptation circuit 512, according to some embodiments of the disclosure. As shown in FIG. 5B, in some embodiments, the adaptation circuit 512 may be implemented using a time alignment circuit 504, a combiner 506, an adaptation algorithm 508, and a post-DPD circuit 510. The time alignment circuit 504 may be configured to time-align the adaptation circuit output signal 513 to a post-DPD output signal 511, thus generating a time-aligned adaptation circuit output signal 505, so that the combiner 506 can subtract the post-DPD output signal 511 from the time-aligned adaptation circuit output signal 505 to generate a difference signal 507. The difference signal 507 may be provided to the adaptation algorithm 508 which may be configured to generate an adaptation signal 509 based on the difference signal 507. The adaptation signal 509 may provide an indication to the post-DPD circuit 510 as to how the post-DPD output signal 511 should be like in order to reduce, minimize or eliminate the differences between the actual PA output signal 209 and the desired PA output signal 109. The post-DPD circuit 510 may be configured to generate the post-DPD output signal 511 based on two inputs thereto: the adaptation signal 509 and the digital version 307 of the PA output signal 209. The post-DPD output signal 511 may also be provided to the DPD circuit 502 as the adaptation circuit output signal 513. The adaptation circuit 512 as shown in FIG. 5B is just one of many possibilities of an adaptive signal processing algorithm that may be implemented to enable the digital equalizer circuit 304, in presence of the DPD circuit 502, to compare outputs in the forward and in the feedback paths (i.e., to compare the digitally predistorted output signal 503 received by the digital equalizer circuit 304 in the forward path with the adaptation circuit output signal 513 received by the digital equalizer circuit 304, via the DPD circuit 502, in the feedback path) and try to minimize their difference. Other implementations of how the digital equalizer circuit 304 may be trained in accordance with embodiments described herein are also within the scope of the present disclosure.

Example Cable Communication Systems with a Frequency-Segmented PA and Digital TC In various embodiments, a TC circuit may be implemented completely in analog domain, completely in digital domain, or in some combination of analog and digital domains. Descriptions provided with respect to the TC circuit 106 mainly related to the analog implementation of the TC circuit. FIGS. 6 and 7 illustrate different embodiments of implementing the frequency-segmented PA 208 as described above, but now in context of a digital TC circuit 606.

Figure 6A:
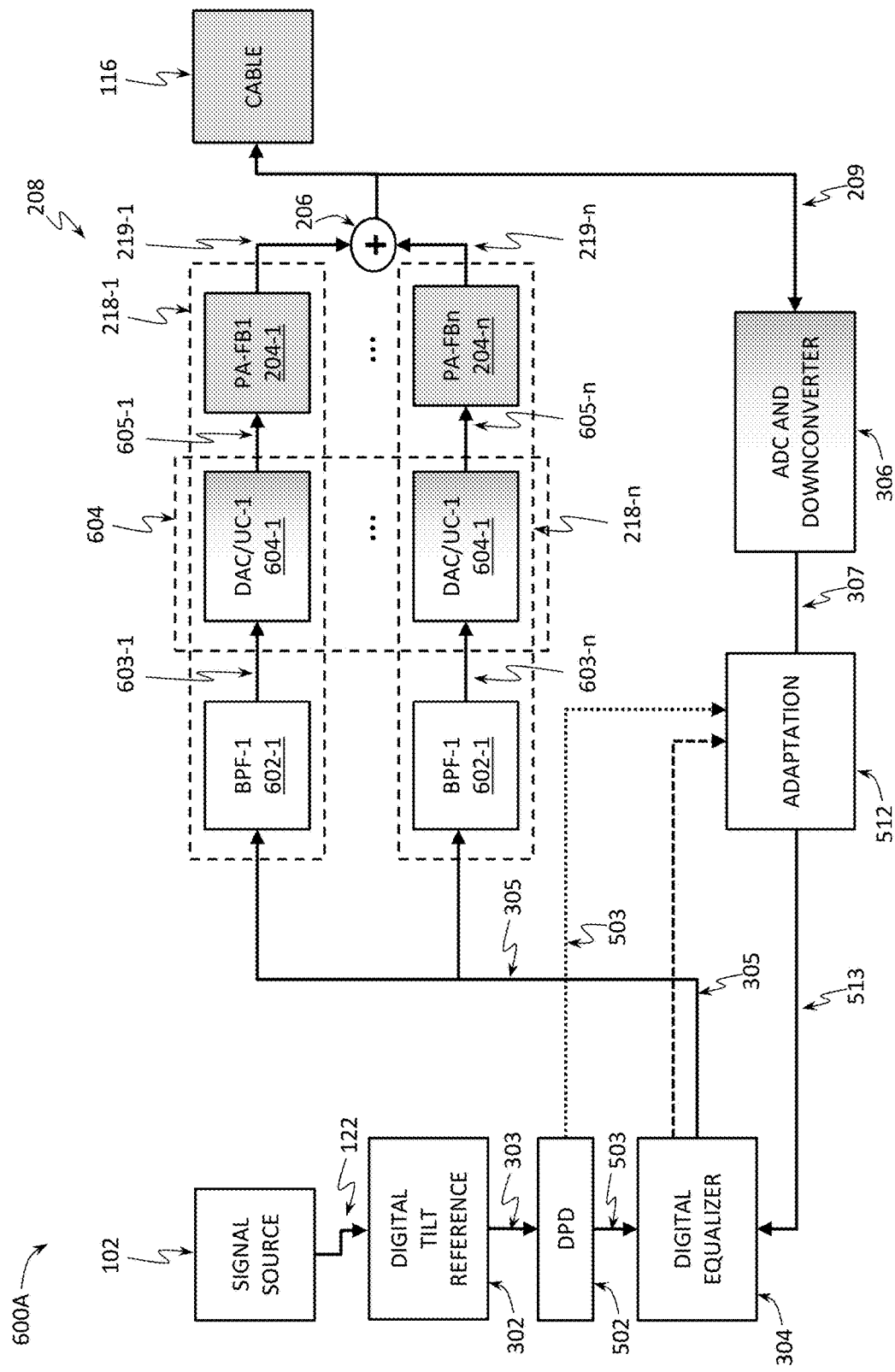
FIG. 6A illustrates a cable communication system with a frequency-segmented PA and a digital TC circuit, according to some embodiments of the present disclosure.
Figure 7:
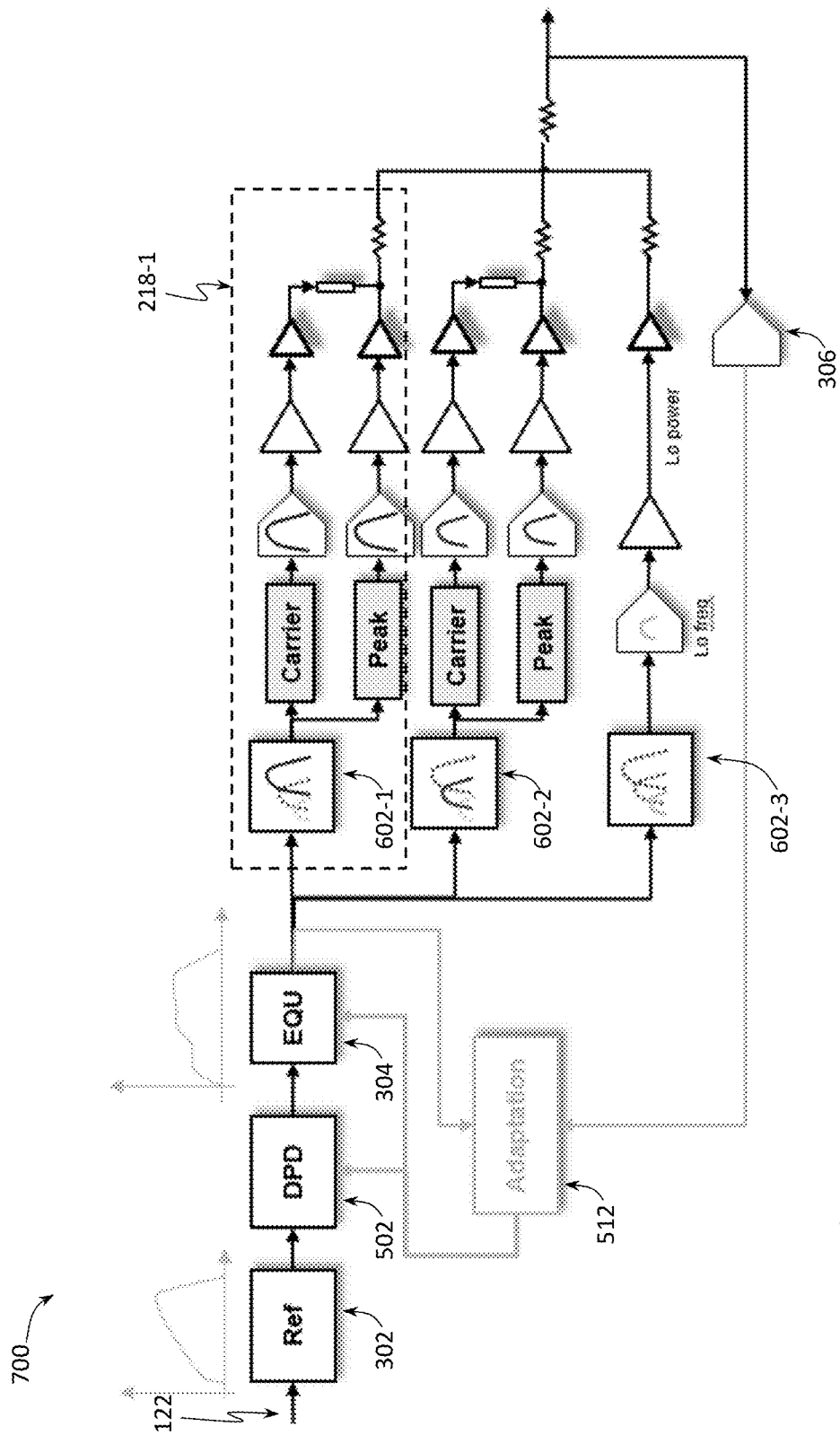
FIG. 7 illustrates a cable communication system with a frequency-segmented PA, a digital TC circuit, and Doherty PAs, according to some embodiments of the present disclosure.

FIG. 6A illustrates a cable communication system 600A with a frequency-segmented PA and a digital TC circuit, according to some embodiments of the present disclosure. The cable communication system 600A shown in FIG. 6A is similar to the system 500A of FIG. 5A in that it also includes the signal source 102, the cable 110, the frequency-segmented PA 208, the digital tilt reference circuit 302, the digital equalizer circuit 304, the DPD circuit 502 between the digital tilt reference circuit 302 and the digital equalizer circuit 304, the ADC and downconverter circuit 306, and the adaptation circuit 512, as described above. In contrast to the illustration of FIG. 5A, the BPFs 202 of the PA 208 may be replaced by BPFs 602, configured to perform analogous filtering of frequency components for different frequency bands handled by different PA segments 218, but now in the digital domain. Thus, BPFs 602 are digital BPFs. Furthermore, the system 600A does not include the TC circuit 106 because, in the embodiment of FIG. 6A, the tilt compensation may effectively be implemented in the digital domain, as part of the digital BPFs 602. Still further, as shown in FIG. 6A, the system 600A may include a DAC and upconverter circuit 604, configured to implement digital-to-analog conversion and frequency upconversion, which is similar to and replaces the DAC and upconverter circuit 104 shown in FIG. 5A, except that in the embodiment of FIG. 6A each of the PA segments 218 may include an own DAC and upconverter circuit 604-1, . . . , 604-n.

Color coding used in the illustration of FIGS. 2, 3A, 4A, and 5A is further maintained in FIG. 6A. Thus, for the embodiment of the cable communication system 600A, each of the digital tilt reference circuit 302, the digital equalizer circuit 304, the adaptation circuit 512, the DPD circuit 502, and the BPF circuits 602-1, . . . , 602-n may be a digital circuit, while the PA-FB1, . . . , PA-FBn circuits may be respective analog circuits, with the DAC and upconverter circuits 604-1, . . . , 604-n performing conversion from the digital to the analog domain and the downconverter 306 performing conversion from the analog to the digital domain.

In some embodiments, tilt compensation may be performed in digital domain, e.g., by having each of the BPFs 602-1, . . . , 602-n apply appropriate gain in addition to performing band-pass filtering to filter signal components of the respective frequency bands of the PA segments 218-1, . . . , 218-n. In such a scenario of digital tilt, as shown in FIG. 6A, for each of the PA segment 218-i (where i is an integer indicating a given PA segment, i.e., i is an integer between 1 and n), a signal indicative of a digitally tilted BPF output 603-i (i.e., a respective one of the outputs BPF 603-1, . . . , 603-n) may be provided to a respective DAC and upconverter circuit 604-i (i.e., a respective one of the DAC and upconverter circuits 604-1, . . . , 604-n). Then, a signal indicative of an analog upconverted output 605-i (i.e., a respective one of the outputs 605-1, . . . , 605-n) may be provided to a respective PA-FB 204-i (i.e., a respective one of the PA-FBs 204-1, . . . , 204-n). Implementing tilt digitally may advantageously allow the system designer to more readily tune the tilt characteristics to better equalize out the cable losses. In conventional cable transmission systems, however, digital tilt is not feasible as it would require a DAC with impractically (currently impossible) large signal-to-noise ratio (SNR). By frequency segmenting the signal using the frequency-segmented PA as described herein, though, the SNR requirements, for the individual DACs may become more practical.

Figure 6B:
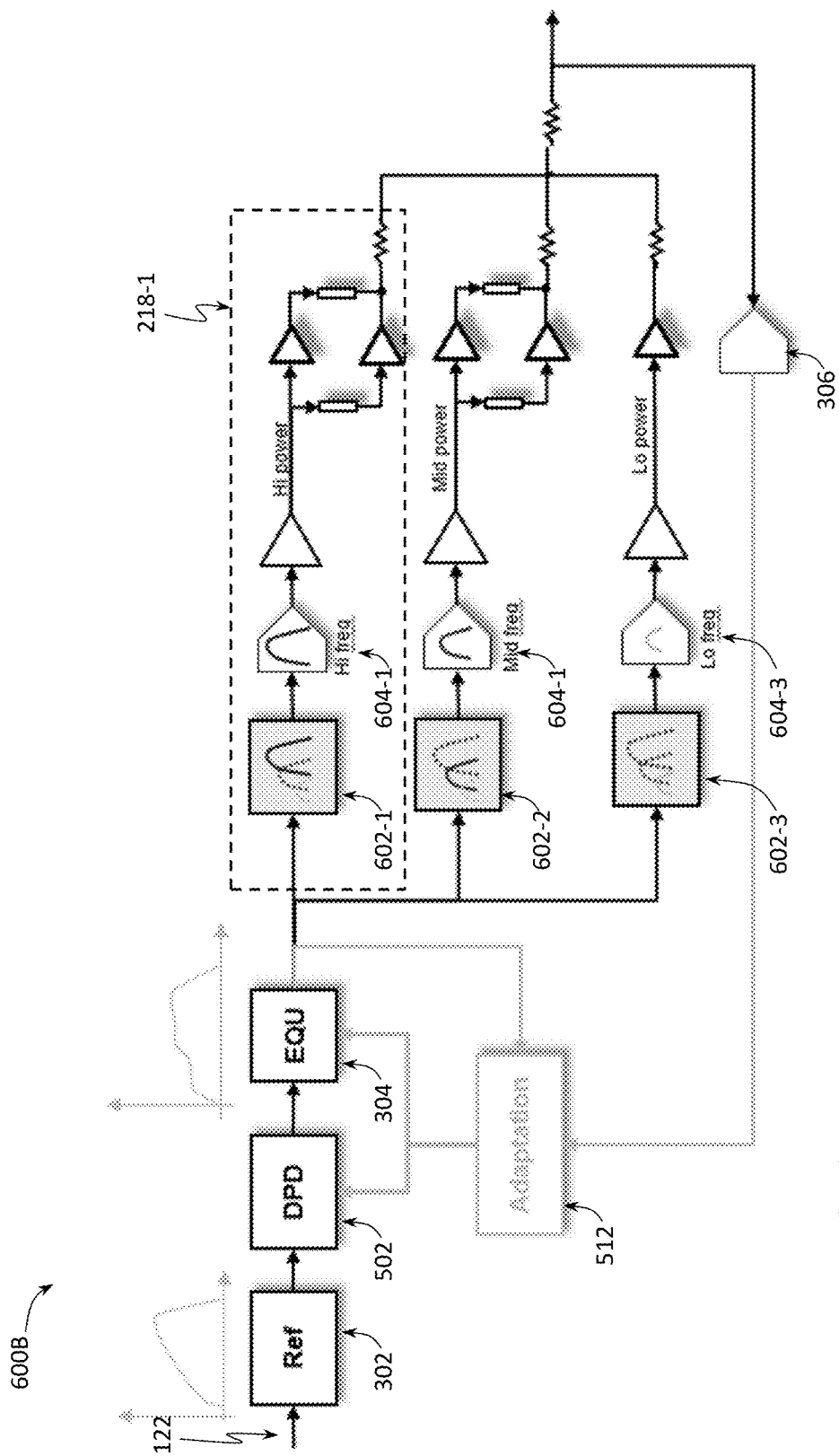
FIG. 6B illustrates a portion of an example implementation of the cable communication system of FIG. 6A, according to some embodiments of the present disclosure.

FIG. 6B illustrates a portion 600B of an example implementation of the cable communication system of FIG. 6A, according to some embodiments of the present disclosure. In particular, FIG. 6B illustrates the example described above, where high- and mid-band power amplification of the PA segments 218-1 and 218-2 is carried out using Doherty amplifiers, whereas the low-band power amplification of the PA segment 218-3 is carried out using a class AB amplifier, except that now this PA design is shown for the digital tilt implementation. In order to not clutter the drawing, only one PA segment, namely 218-1, is labeled with a reference numeral and shown with a dashed contour in FIG. 6B.

FIG. 7 illustrates a cable communication system 700 with a frequency-segmented PA, a digital TC circuit, and Doherty PAs, according to some embodiments of the present disclosure. The system of FIG. 7 is similar to the system 600B of FIG. 6B, where elements shown in FIG. 7 using the reference numerals of FIG. 6B are intended to illustrate the same or analogous elements, so that, in the interests of brevity, their description is not repeated again. What is explicitly shown in the system of FIG. 7 is that, in some embodiments, the PA-FBs 204 in different branches may be implemented as different types of PAs. Namely, FIG. 7 illustrates the example similar to that shown in FIG. 6B, where high- and mid-band power amplification is carried out using Doherty amplifiers, whereas the low-band power amplification is carried out using a class AB amplifier, except that now this PA design is shown for the digital tilt implementation (similar to FIG. 6B, in order to not clutter the drawing, only one PA segment, namely 218-1, is labeled with a reference numeral and shown with a dashed contour in FIG. 7). Since, as is known in the art, a Doherty amplifier separates an incoming signal into a carrier signal and a peak signal, as is shown in FIG. 7, this means that for each Doherty amplifier being used, two DACs need to be used—one for converting the carrier signal and one for converting the peak signal. A Doherty amplifier may employ a ¼ wave transformer at the input to slit the signal into the carrier and peak components. Conventionally, design of the ¼ wave transformer can be challenging, especially over wider bandwidths and lower frequencies and any imperfections may translate into degraded linearity and efficiency. Done digitally, the ¼-wave transformation can be realized with greater accuracy and lead to superior performance. In addition, having gone to the expense of digitally segmenting the signal, e.g., the added cost of the DACs, the additional overhead of the carrier and peak processing to realize the ¼ wave transformation may be secondary.

While FIGS. 6 and 7 illustrate embodiments where the DPD circuit 502, the adaptation circuit 513, the digital tilt reference circuit 302, and the digital equalizer circuit 304 are used, similar to FIG. 5 provided for the analog tilt embodiment, other embodiments where digital tilt is being implemented may be envisions without the use of one or more of these components, similar to the analog tilt embodiments described with reference to FIGS. 2-4. All of such variations of the digital tilt embodiments are within the scope of the present disclosure.

As described above, in some embodiments, a TC circuit may be implemented in a combination of analog and digital domains. Implementation of a TC circuit partially in analog and partially in digital domain is not shown in the present figures, but is within the scope of the present disclosure. As a person of ordinary skill in the art would recognize based on the descriptions provided herein, splitting the TC circuit between the digital and analog may be advantageous in certain scenarios. For example, some crude tilt may be implemented in analog domain and then complemented and fine-tuned digitally, which may relax the SNR requirement of the DACs.

Example Data Processing System

Figure 8:
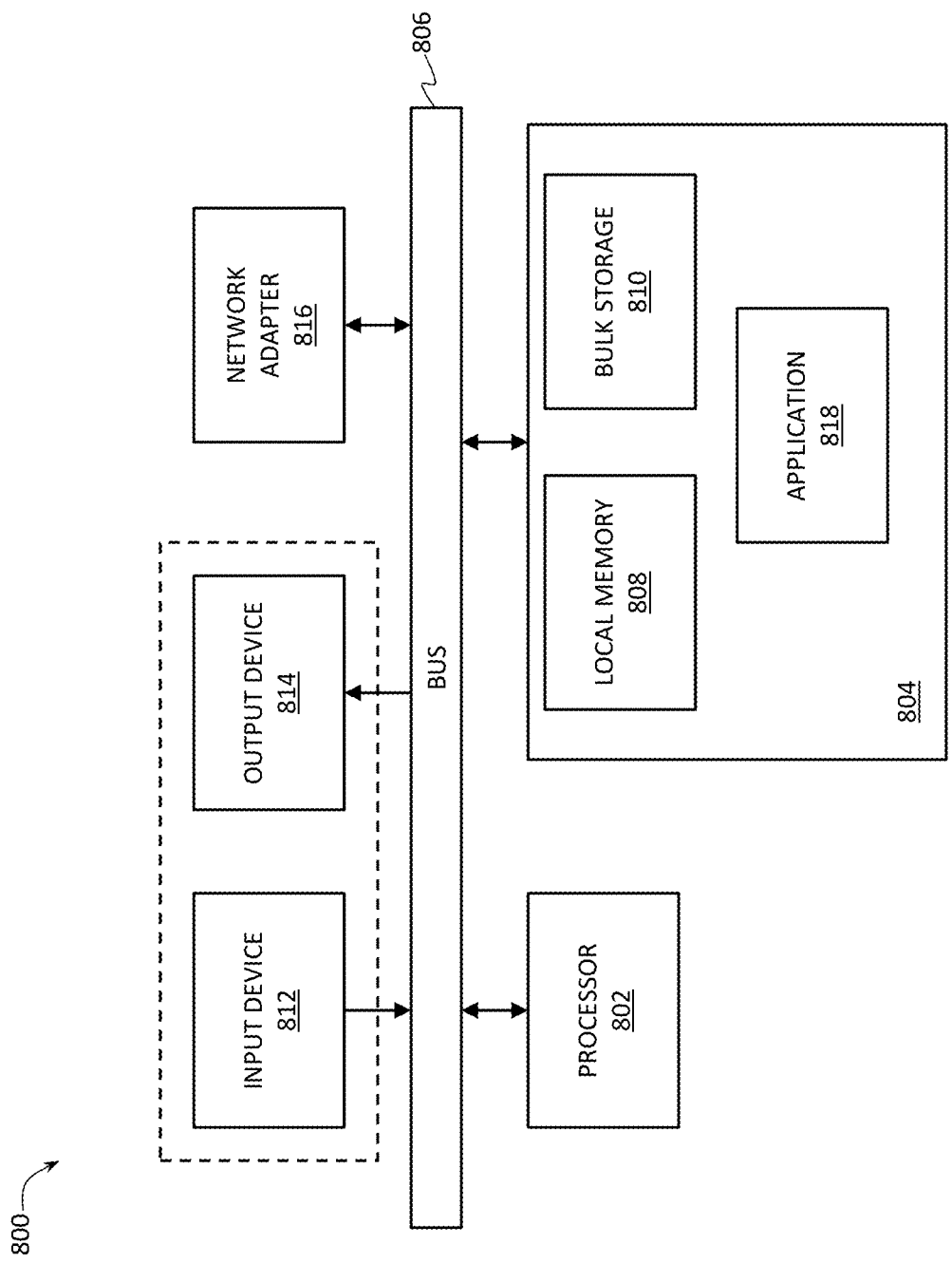
FIG. 8 provides a block diagram illustrating an example data processing system that may be configured to implement at least portions of frequency-segmented power amplification, according to some embodiments of the present disclosure.

FIG. 8 provides a block diagram illustrating an example data processing system 800 that may be configured to implement at least portions of cable or wireless communication systems with frequency-segmented power amplification as described herein, e.g., of the cable communication systems as described with reference to FIGS. 1-7, according to some embodiments of the present disclosure.

As shown in FIG. 8, the data processing system 800 may include at least one processor 802, e.g. a hardware processor 802, coupled to memory elements 804 through a system bus 806. As such, the data processing system may store program code within memory elements 804. Further, the processor 802 may execute the program code accessed from the memory elements 804 via a system bus 806. In one aspect, the data processing system may be implemented as a computer that is suitable for storing and/or executing program code. It should be appreciated, however, that the data processing system 800 may be implemented in the form of any system including a processor and a memory that is capable of performing the functions described within this disclosure.

In some embodiments, the processor 802 can execute software or an algorithm to perform the activities as discussed in this specification, in particular activities related to frequency-segmented power amplification, such as various techniques implemented by the DPD circuit 502 described herein, various techniques implemented by the tilt reference circuit 302 and/or the digital equalizer circuit 304, and so on. The processor 802 may include any combination of hardware, software, or firmware providing programmable logic, including by way of non-limiting example a microprocessor, a digital signal processor (DSP), a field-programmable gate array (FPGA), a programmable logic array (PLA), an integrated circuit (IC), an application specific IC (ASIC), or a virtual machine processor. The processor 802 may be communicatively coupled to the memory element 804, for example in a direct-memory access (DMA) configuration, so that the processor 802 may read from or write to the memory elements 804.

In general, the memory elements 804 may include any suitable volatile or non-volatile memory technology, including double data rate (DDR) random access memory (RAM), synchronous RAM (SRAM), dynamic RAM (DRAM), flash, read-only memory (ROM), optical media, virtual memory regions, magnetic or tape memory, or any other suitable technology. Unless specified otherwise, any of the memory elements discussed herein should be construed as being encompassed within the broad term "memory." The information being measured, processed, tracked or sent to or from any of the components of the data processing system 800 could be provided in any database, register, control list, cache, or storage structure, all of which can be referenced at any suitable timeframe. Any such storage options may be included within the broad term "memory" as used herein. Similarly, any of the potential processing elements, modules, and machines described herein should be construed as being encompassed within the broad term "processor." Each of the elements shown in the present figures, e.g., any of the circuits/components shown in FIGS. 1-7, can also include suitable interfaces for receiving, transmitting, and/or otherwise communicating data or information in a network environment so that they can communicate with, e.g., the data processing system 800 of another one of these elements.

In certain example implementations, mechanisms for implementing frequency-segmented power amplification in cable or wireless communication systems as outlined herein may be implemented by logic encoded in one or more tangible media, which may be inclusive of non-transitory media, e.g., embedded logic provided in an ASIC, in DSP instructions, software (potentially inclusive of object code and source code) to be executed by a processor, or other similar machine, etc. In some of these instances, memory elements, such as e.g. the memory elements 804 shown in FIG. 8, can store data or information used for the operations described herein. This includes the memory elements being able to store software, logic, code, or processor instructions that are executed to carry out the activities described herein. A processor can execute any type of instructions associated with the data or information to achieve the operations detailed herein. In one example, the processors, such as e.g. the processor 802 shown in FIG. 8, could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., an FPGA, a DSP, an erasable programmable read-only memory (EPROM), an electrically erasable programmable read-only memory (EEPROM)) or an ASIC that includes digital logic, software, code, electronic instructions, or any suitable combination thereof.

The memory elements 804 may include one or more physical memory devices such as, for example, local memory 808 and one or more bulk storage devices 810. The local memory may refer to RAM or other non-persistent memory device(s) generally used during actual execution of the program code. A bulk storage device may be implemented as a hard drive or other persistent data storage device. The processing system 800 may also include one or more cache memories (not shown) that provide temporary storage of at least some program code in order to reduce the number of times program code must be retrieved from the bulk storage device 810 during execution.

As shown in FIG. 8, the memory elements 804 may store an application 818. In various embodiments, the application 818 may be stored in the local memory 808, the one or more bulk storage devices 810, or apart from the local memory and the bulk storage devices. It should be appreciated that the data processing system 800 may further execute an operating system (not shown in FIG. 8) that can facilitate execution of the application 818. The application 818, being implemented in the form of executable program code, can be executed by the data processing system 800, e.g., by the processor 802. Responsive to executing the application, the data processing system 800 may be configured to perform one or more operations or method steps described herein.

Input/output (I/O) devices depicted as an input device 812 and an output device 814, optionally, can be coupled to the data processing system. Examples of input devices may include, but are not limited to, a keyboard, a pointing device such as a mouse, or the like. Examples of output devices may include, but are not limited to, a monitor or a display, speakers, or the like. In some embodiments, the output device 814 may be any type of screen display, such as plasma display, liquid crystal display (LCD), organic light emitting diode (OLED) display, electroluminescent (EL) display, or any other indicator, such as a dial, barometer, or light emitting diode (LED). In some implementations, the system may include a driver (not shown) for the output device 814. Input and/or output devices 812, 814 may be coupled to the data processing system either directly or through intervening I/O controllers.

In an embodiment, the input and the output devices may be implemented as a combined input/output device (illustrated in FIG. 8 with a dashed line surrounding the input device 812 and the output device 814). An example of such a combined device is a touch sensitive display, also sometimes referred to as a "touch screen display" or simply "touch screen". In such an embodiment, input to the device may be provided by a movement of a physical object, such as e.g. a stylus or a finger of a user, on or near the touch screen display.

A network adapter 816 may also, optionally, be coupled to the data processing system to enable it to become coupled to other systems, computer systems, remote network devices, and/or remote storage devices through intervening private or public networks. The network adapter may comprise a data receiver for receiving data that is transmitted by said systems, devices and/or networks to the data processing system 800, and a data transmitter for transmitting data from the data processing system 800 to said systems, devices and/or networks. Modems, cable modems, and Ethernet cards are examples of different types of network adapter that may be used with the data processing system 800.

Figure 9:
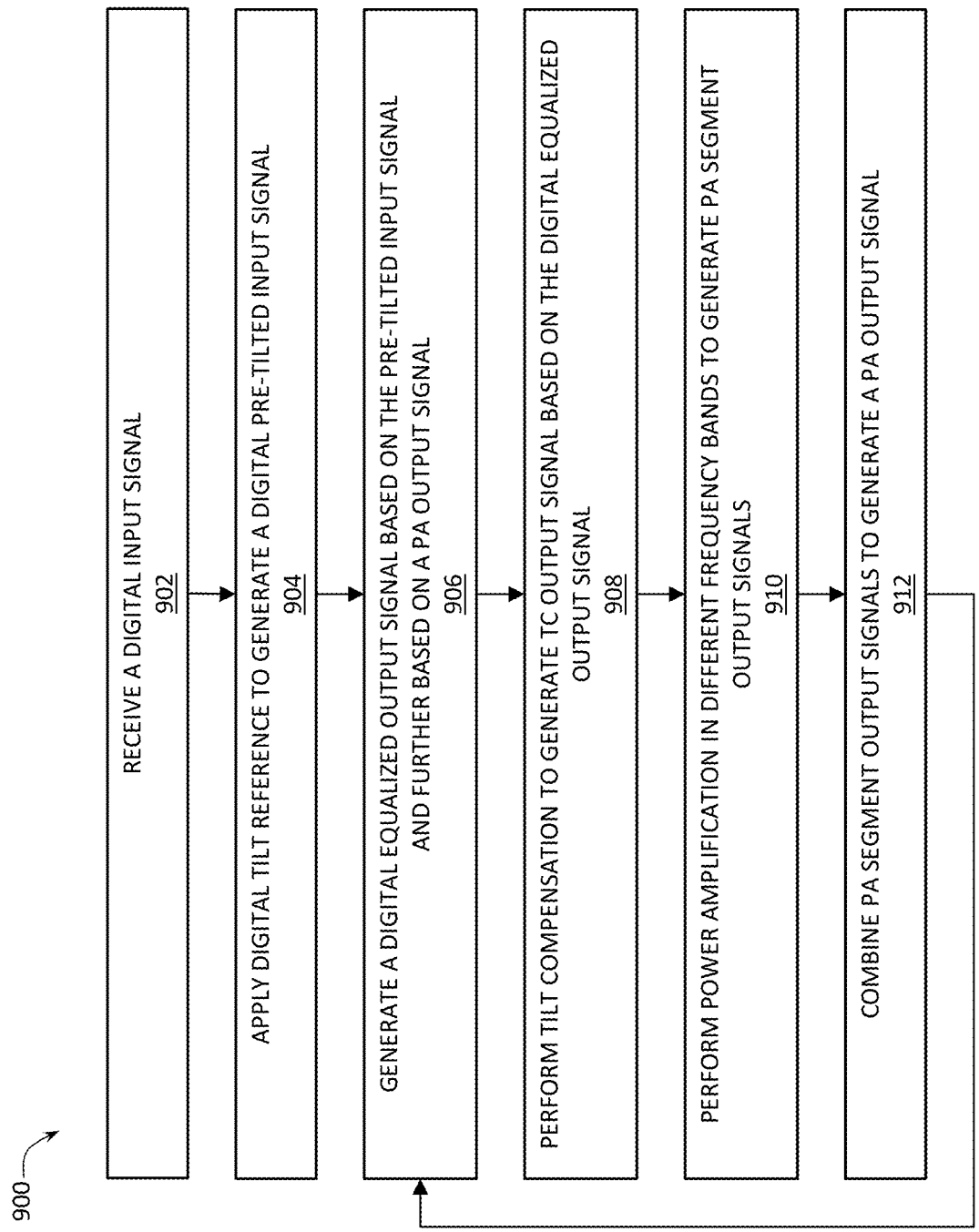
FIG. 9 provides a flow chart of a method for implementing frequency-segmented power amplification in a cable communication system, according to some embodiments of the present disclosure.

Example Method for Implementing Frequency-Segmented Power Amplification in a Cable System FIG. 9 provides a flow chart of a method 900 for implementing frequency-segmented power amplification in a cable communication system, according to some embodiments of the present disclosure. At least portions of the method 900 may be implemented by elements of a cable communication system according to any embodiments of the present disclosure, e.g., by the cable communication systems described with reference to FIGS. 1-7, or/and by one or more data processing systems, such as the data processing system 800 shown in FIG. 8. Although described with reference to system components of the systems shown in the present figures, any system, configured to perform operations of the method 900, in any order, is within the scope of the present disclosure.

The method 900 may begin with receiving a digital input signal at 902. In some embodiments, 902 may include a signal source providing a digital signal as an input to the data processing system of a cable transmitter. For example, in some embodiments, 902 may include the signal source 102 providing the signal 122 as the digital input signal to whichever next component of the cable communication system is coupled to the output of the signal source 102 (e.g., to the digital tilt reference circuit 302).

At 904, the method 900 may include applying a digital frequency filtering to a signal indicative of the digital input signal received at 902, to generate a digital frequency-modified signal, where the digital frequency filtering is to emulate an analog or digital tilt compensation frequency modification to be applied downstream (i.e., further down the signal path of the signal to be transmitted from the frequency-segmented PA 208 over the wired connection). As used herein, an expression such as "a signal A indicative of a signal B" means that either signal A is the signal B, or that signal A is some processed version of signal B. For example, in some embodiments, 904 may include the digital tilt reference circuit 302 applying a digital frequency filtering to the digital input signal 122 received from the signal source 322, as shown in FIGS. 3A-7. In various embodiments, applying a digital frequency filtering at 904 may include applying a digital uptilt frequency filtering as described herein. For example, in some embodiments, applying a digital frequency filtering at 904 may include the digital tilt reference circuit 302 applying, to the digital input signal provided thereto, a frequency response selected to emulate a frequency response of the TC circuit 106, to generate a pre-tilted input signal, as described herein, e.g., to generate the pre-tilted input signal 303 described herein.

At 906, the method 900 may include applying an equalization to a signal based on the pre-tilted input signal generated at 904 to compensate for one or more impairments in the tilt profile due to the frequency-segmented power amplification, to generate a digital equalized output signal. For example, in some embodiments, 906 may include the digital equalizer circuit 304 performing equalization of the input signal provided thereto, e.g., using a feedback signal also provided thereto, e.g., using a signal based on the downconverted digital version 307 of the PA output signal 209, to generate an equalized output signal, e.g., to generate the equalized output signal 305. In some embodiments, 906 may include the digital equalizer circuit 304 performing equalization using any of the adaptation circuits described herein. In some embodiments, 906 may include the digital equalizer circuit 304 performing equalization on the pre-tilted input signal 303 that has undergone DPD modification as shown in FIGS. 5A-5B and 6A-6B.

At 908, the method 900 may include applying an analog or digital frequency modification to a signal based on the digital equalized output signal generated at 906, to generate an analog or digital TC output signal. For example, in some embodiments, 908 may include the TC circuit 106 generating a tilted input signal by applying a TC to a signal based on the equalized output signal 305 generated at 906, as described herein. In some embodiments, 908 may include performing a digital-to-analog conversion of a signal prior to applying the analog frequency modification.

At 910, the method 900 may include performing power amplification using PA circuits in different segments, where different segments are configured to provide power amplification for different frequency bands. In some embodiments, 910 may include the frequency-segmented PA 208 performing power amplification using different segments 218 as described herein. In some embodiments, 910 may include the frequency-segmented PA 208 performing power amplification using a signal based on the signal generated at 908 as the PA input signal 207. As a result, 910 may include generation of PA segment output signals 219 for different PA segments 218, as described herein.

At 912, the method 900 may include combining the PA segment output signals 219 generated by the different PA segments 218 at 910, e.g., using a combiner, e.g., the adder 206 described herein, to generate a PA output signal, e.g. the PA output signal 209. In some embodiments, the method 900 may proceed with providing a signal based on the PA output signal generated at 912 along a feedback path to the digital equalizer circuit (e.g., via the DPD circuit, if a DPD circuit is implemented, as described herein), so that the digital equalizer circuit may use the feedback signal in order to perform equalization as described herein. Such a feedback path is illustrated in FIG. 9 with an arrow from 912 to 906. The method 900 may then continue to operate on subsequently provided portions of the digital input signal, provided at 902.

Although not specifically shown in FIG. 9, in some embodiments, the method 900 may also include transmitting over the wired connection a signal based on the analog PA output signal generated at 912.

SELECT EXAMPLES

Example 1 provides a cable communication system configured to enable communication of signals over a wired connection. The system includes a TC circuit and a segmented PA circuit. The TC circuit is configured to receive a TC input signal, where the TC input signal is based on a signal provided by a signal source, and apply a tilt compensation to the TC input signal to generate a TC output signal. The segmented PA circuit includes a plurality of PA segments and a combiner. Each PA segment of the plurality of PA segments is configured to amplify a portion of a PA input signal in a different frequency band to generate a PA segment output signal, where the PA input signal is based on the TC output signal. The combiner (e.g., an adder) is configured to combine the PA segment output signals from the plurality of PA segments to generate a PA output signal.

Example 2 provides the cable communication system according to example 1, further including a DAC configured to convert the signal provided by the signal source from a digital version to an analog version, where the TC input signal is an analog signal based on the analog version of the signal provided by the signal source.

Example 3 provides the cable communication system according to example 2, further including a frequency mixer configured to perform frequency mixing of the analog version of the signal provided by the signal source and a LO signal to generate an upconverted analog version of the signal provided by the signal source, where the TC input signal is the analog signal based on the upconverted analog version of the signal provided by the signal source.

Example 4 provides the cable communication system according to example 1, further including a conversion circuit configured to generate an upconverted analog version of the signal provided by the signal source by converting the signal provided by the signal source from a digital version to an analog version and performing frequency mixing of the signal provided by the signal source and a LO signal, where the TC input signal is an analog signal based on the upconverted analog version of the signal provided by the signal source.

Example 5 provides the cable communication system according to any one of the preceding examples, further including a digital tilt reference circuit and a digital equalizer circuit, where the digital tilt reference circuit is configured to generate a pre-tilted input signal based on the signal provided by the signal source by applying, to a digital version of the signal provided by the signal source, a frequency response configured to emulate (e.g., a frequency response that is the same as) a frequency response of the TC circuit, the digital equalizer circuit is configured to generate an equalized output signal based on the pre-tilted input signal and further based on the PA output signal, and the TC input signal received by the TC circuit is based on the equalized output signal generated by the digital equalizer (e.g., the TC input signal may be an analog signal based on the upconverted analog version of the equalized output signal generated by the digital equalizer, e.g., generated according to examples 3 or 4 but, more specifically, by being based on the equalized output signal generated by the digital equalizer).

Example 6 provides the cable communication system according to example 5, where the digital equalizer circuit configured to generate the equalized output signal based on the pre-tilted input signal and further based on the PA output signal includes the digital equalizer circuit configured to generate the equalized output signal such that, when the TC input signal received by the TC circuit is based on the equalized output signal, a deviation of the PA output signal from a desired PA output signal based on the pre-tilted input signal satisfies one or more criteria.

Example 7 provides the cable communication system according to examples 5 or 6, where the digital equalizer circuit configured to generate the equalized output signal based on the pre-tilted input signal and further based on the PA output signal includes the digital equalizer circuit configured to generate the equalized output signal such that, when the TC input signal received by the TC circuit is based on the equalized output signal, a deviation of the PA output signal from a desired PA output signal based on the pre-tilted input signal is below a deviation function (where the deviation function may define threshold deviation values, e.g., in terms of percentage of deviation or in terms of absolute values of deviation, for different frequency components of the desired PA output signal and the actual PA output signal).

Example 8 provides the cable communication system according to any one of examples 5-7, where each of the digital tilt reference circuit and the digital equalizer circuit is a digital circuit (i.e., a circuit that receives an input of, operates on, and produces an output of digital signals), and the TC circuit is an analog circuit (i.e., a circuit that receives an input of, operates on, and produces an output of analog signals).

Example 9 provides the cable communication system according to any one of examples 5-8, further including an ADC configured to convert the PA output signal from an analog version to a digital version prior to providing the PA output signal to the digital equalizer circuit (i.e., the digital equalizer circuit is configured to generate the equalized output signal based on the digital pre-tilted input signal and further based on the digital version of the PA output signal).

Example 10 provides the cable communication system according to any one of examples 5-9, further including a DPD circuit, where the DPD circuit is configured to generate an output DPD signal by applying a DPD to a DPD input signal, where the DPD input signal is based on the pre-tilted input signal generated by the digital tilt reference circuit, and the digital equalizer circuit configured to generate the equalized output signal based on the pre-tilted input signal includes the digital equalizer circuit configured to generate the equalized output signal based on the DPD output signal.

Example 11 provides the cable communication system according to example 10, where the DPD circuit is a digital circuit.

Example 12 provides the cable communication system according to any one of examples 5-10, where the digital tilt reference circuit is a frequency-selective digital uptilt circuit having a high-pass frequency response selected to emulate a high-pass frequency response of the analog TC circuit.

Example 13 provides the cable communication system according to example 1, where the TC circuit includes a plurality of TC circuit segments, where each of the plurality of TC circuit segments corresponds to a different one of the plurality of PA segments, and where the each of the plurality of TC circuit segments is configured to generate a TC segment output signal in the different frequency band of the corresponding one of the plurality of PA segments, the cable communication system further includes a plurality of DACs, where each of the plurality of DACs corresponds to a different one of the plurality of TC circuit segments, and where each of the plurality of DACs is configured to convert the TC segment output signal from a digital version to an analog version and provide the digital version of the TC segment output signal to the corresponding one of the plurality of PA segments.

Example 14 provides the cable communication system according to example 1, where a first portion of the TC circuit is an analog circuit and a second portion of the TC circuit is a digital circuit.

Example 15 provides a cable communication system configured to enable communication of signals over a wired connection, the system including a first segment, a second segment, and a combiner. The first segment is configured to generate a first amplified segment signal by applying tilt compensation and power amplification to a first portion of an input signal, where the first portion includes frequency components of the input signal in a first frequency band. The second segment is configured to generate a second amplified segment signal by applying tilt compensation and power amplification to a second portion of the input signal, where the second portion includes frequency components of the input signal in a second frequency band, where one or more of the frequency components of the first frequency band are not included in the frequency components of the second frequency band and/or vice versa. The combiner (e.g., an adder) configured to combine the first amplified segment signal and the second amplified segment signal to generate an amplified output signal (i.e., to generate a PA output signal).

In some embodiments, tilt compensation for the first and second portions of the input signal may be provided by a single TC circuit configured to apply tilt compensation to a TC input signal, which may be any signal based on a signal provided by a signal source. In other embodiments, tilt compensation for the first and second portions of the input signal may be provided by different circuits, each configured to operate on different respective frequency bands. For example, in some such embodiments, tilt compensation may be implemented as a part of power amplification applied to the respective portion of the input signal, such that portions of the input signal in different frequency bands are amplified by different amounts, thereby effectively implementing tilt compensation within a PA circuit segment.

Example 16 provides the cable communication system according to example 15, further including a digital tilt reference circuit and a digital equalizer circuit, where the digital tilt reference circuit is configured to generate a pre-tilted input signal based on the input signal by applying a frequency response configured to emulate (e.g., a frequency response that is the same as) a frequency response of the tilt compensation applied by the first and the second segments. The digital equalizer circuit is configured to generate an equalized output signal based on the pre-tilted input signal and further based on the amplified output signal (i.e., based on the PA output signal). The first segment is configured to generate the first amplified segment signal by applying tilt compensation and power amplification to the first portion of the equalized output signal. The second segment is configured to generate the second amplified segment signal by applying tilt compensation and power amplification to the second portion of the equalized output signal.

Example 17 provides the cable communication system according to example 16, where the digital equalizer circuit configured to generate the equalized output signal based on the pre-tilted input signal and further based on the amplified output signal includes the digital equalizer circuit configured to generate the equalized output signal such that, when the equalized output signal is provided as an input to the first and second segments, a deviation of the amplified output signal from the pre-tilted input signal satisfies one or more criteria.

Example 18 provides the cable communication system according to examples 16 or 17, where each of the digital tilt reference circuit and the digital equalizer circuit is a digital circuit (i.e., a circuit that receives an input of, operates on, and produces an output of digital signals), and tilt compensation applied to each of the first portion and the second portion of the input signal is performed in an analog domain.

Example 19 provides the cable communication system according to any one of examples 16-18, further including an ADC configured to convert the amplified output signal from an analog version to a digital version prior to providing the amplified output signal to the digital equalizer circuit (i.e., the digital equalizer circuit is configured to generate the equalized output signal based on the digital pre-tilted input signal and further based on the digital version of the amplified output signal).

Example 20 provides the cable communication system according to any one of the preceding examples, where a signal based on the amplified output signal is to be transmitted over the wired connection (i.e., a cable).

Example 21 provides the cable communication system according to any one of the preceding examples, where the cable communication system is a cable television system.

Example 22 provides a method for transmitting a signal over a wired connection. The method includes receiving an input signal; generating a first amplified segment signal by applying tilt compensation and power amplification to a first portion of the input signal, where the first portion includes frequency components of the input signal in a first frequency band; generating a second amplified segment signal by applying tilt compensation and power amplification to a second portion of the input signal, where the second portion includes frequency components of the input signal in a second frequency band, where one or more of the frequency components of the first frequency band are not included in the frequency components of the second frequency band and/or vice versa; and generating a PA output signal based on the first amplified segment signal and the second amplified segment signal.

Example 23 provides the method according to example 22, wherein the method is used with the cable communication system according to any one of the preceding examples.

Example 24 provides a method of operating the cable communication system according to any one of the preceding examples.

Example 25 provides a non-transitory computer-readable storage medium including instructions for execution which, when executed by a processor, are operable to perform operations according to the method of any one of the preceding examples, or operations to enable functionality of the cable communication system according to any one of the preceding examples. Thus, in some examples, the non-transitory computer-readable storage medium according to example 25 may further include instructions operable to perform operations performed by any parts of the cable communication system in accordance with any one of the preceding examples.

VARIATIONS AND IMPLEMENTATIONS

While embodiments of the present disclosure were described above with references to exemplary implementations as shown in FIGS. 1-9, a person skilled in the art will realize that the various teachings described above are applicable to a large variety of other implementations.

In certain contexts, the features discussed herein can be applicable to automotive systems, safety-critical industrial applications, medical systems, scientific instrumentation, wireless and wired communications, radio, radar, industrial process control, audio and video equipment, current sensing, instrumentation (which can be highly precise), and other digital-processing-based systems.

In the discussions of the embodiments above, components of a system, such as combiners, adders, filters, converters, and/or other components can readily be replaced, substituted, or otherwise modified in order to accommodate particular circuitry needs. Moreover, it should be noted that the use of complementary electronic devices, hardware, software, etc., offer an equally viable option for implementing the teachings of the present disclosure related to frequency-segmented power amplification.

Parts of various systems for implementing frequency-segmented power amplification in cable and wireless communication systems as proposed herein can include electronic circuitry to perform the functions described herein. In some cases, one or more parts of the system can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed-signal domain. In some instances, the processor may be configured to carrying out the functions described herein by executing one or more instructions stored on a non-transitory computer-readable storage medium.

In one example embodiment, any number of electrical circuits of the present figures may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of DSPs, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the present figures may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often RF functions: all of which may be provided on a single chip substrate. Other embodiments may include a multi-chip-module (MCM), with a plurality of separate ICs located within a single electronic package and configured to interact closely with each other through the electronic package.

It is also imperative to note that all of the specifications, dimensions, and relationships outlined herein (e.g., the number of components of the cable communication systems shown in FIGS. 1-7, etc.) have only been offered for purposes of example and teaching only. It should be appreciated that the system can be consolidated in any suitable manner. Along similar design alternatives, any of the illustrated circuits, components, modules, and elements of the present figures may be combined in various possible configurations, all of which are clearly within the broad scope of this specification. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

It is also important to note that the functions related to operation of one or more communication systems implementing frequency-segmented power amplification as proposed herein illustrate only some of the possible functions that may be executed by, or within, cable communication systems. Some of these operations may be deleted or removed where appropriate, or these operations may be modified or changed considerably without departing from the scope of the present disclosure.

The invention claimed is:

1. A cable communication system, comprising:
    a tilt compensation (TC) circuit, configured to receive a TC input signal and apply a tilt compensation to the TC input signal to generate a TC output signal;
    a segmented power amplifier (PA) circuit, comprising:
        a plurality of PA segments, each PA segment configured to amplify a portion of a PA input signal in a different frequency band to generate a PA segment output signal, where the PA input signal is based on the TC output signal, and
        a combiner configured to combine the PA segment output signals from the plurality of PA segments to generate a PA output signal;
    a digital tilt reference circuit, configured to generate a pre-tilted input signal based on a signal provided by a signal source by applying, to a digital version of the signal provided by the signal source, a frequency response configured to emulate a frequency response of the TC circuit; and
    a digital equalizer circuit, configured to generate an equalized output signal based on the pre-tilted input signal and further based on the PA output signal, where the TC input signal is based on the equalized output signal.

2. The cable communication system according to claim 1, further comprising:
    a digital-to-analog converter (DAC) configured to convert the signal provided by the signal source from a digital version to an analog version, wherein the TC input signal is an analog signal based on the analog version of the signal provided by the signal source.

3. The cable communication system according to claim 2, further comprising:
a frequency mixer configured to perform frequency mixing of the analog version of the signal provided by the signal source and a local oscillator signal to generate an upconverted analog version of the signal provided by the signal source,
wherein the TC input signal is the analog signal based on the upconverted analog version of the signal provided by the signal source.

4. The cable communication system according to claim 1, further comprising:
a conversion circuit configured to generate an upconverted analog version of the signal provided by the signal source by converting the signal provided by the signal source from a digital version to an analog version and performing frequency mixing of the signal provided by the signal source and a local oscillator signal,
wherein the TC input signal is an analog signal based on the upconverted analog version of the signal provided by the signal source.

5. The cable communication system according to claim 1, wherein the digital equalizer circuit configured to generate the equalized output signal based on the pre-tilted input signal and further based on the PA output signal includes the digital equalizer circuit configured to generate the equalized output signal such that a deviation of the PA output signal from a desired PA output signal based on the pre-tilted input signal satisfies one or more criteria.

6. The cable communication system according to claim 1, wherein the digital equalizer circuit configured to generate the equalized output signal based on the pre-tilted input signal and further based on the PA output signal includes the digital equalizer circuit configured to generate the equalized output signal such that a deviation of the PA output signal from a desired PA output signal based on the pre-tilted input signal is below a deviation function.

7. The cable communication system according to claim 1, wherein each of the digital tilt reference circuit and the digital equalizer circuit is a digital circuit, and the TC circuit is an analog circuit.

8. The cable communication system according to claim 1, further comprising an analog-to-digital converter (ADC) configured to convert the PA output signal from an analog version to a digital version prior to providing the PA output signal to the digital equalizer circuit.

9. The cable communication system according to claim 1, further comprising a digital predistortion (DPD) circuit, wherein:
the DPD circuit is configured to generate an output DPD signal by applying a DPD to a DPD input signal, where the DPD input signal is based on the pre-tilted input signal, and
the digital equalizer circuit configured to generate the equalized output signal based on the pre-tilted input signal includes the digital equalizer circuit configured to generate the equalized output signal based on the DPD output signal.

10. The cable communication system according to claim 1, wherein the digital tilt reference circuit is a frequency-selective digital uptilt circuit having a high-pass frequency response selected to emulate a high-pass frequency response of the TC circuit.

11. The cable communication system according to claim 1, wherein:
the TC circuit includes a plurality of TC circuit segments, where each of the plurality of TC circuit segments corresponds to a different one of the plurality of PA segments, and where the each of the plurality of TC circuit segments is configured to generate a TC segment output signal in the different frequency band of the corresponding one of the plurality of PA segments,
the cable communication system further includes a plurality of digital-to-analog converters (DACs), where each of the plurality of DACs corresponds to a different one of the plurality of TC circuit segments, and where each of the plurality of DACs is configured to convert the TC segment output signal from a digital version to an analog version and provide the digital version of the TC segment output signal to the corresponding one of the plurality of PA segments.

12. The cable communication system according to claim 1, wherein a first portion of the TC circuit is an analog circuit and a second portion of the TC circuit is a digital circuit.

13. A cable communication system, comprising:
a first segment, configured to generate a first segment signal by applying tilt compensation to a first portion of an input signal, wherein the first portion includes frequency components of the input signal in a first frequency band;
a second segment, configured to generate a second segment signal by applying tilt compensation to a second portion of the input signal, wherein the second portion includes frequency components of the input signal in a second frequency band, wherein one or more of the frequency components of the first frequency band are not included in the frequency components of the second frequency band or vice versa;
a combiner, configured to combine the first segment signal and the second segment signal to generate an output signal;
a digital tilt reference circuit, configured to generate a pre-tilted input signal based on the input signal by applying a frequency response configured to emulate a frequency response of the tilt compensation applied by the first and the second segments,
a digital equalizer circuit, configured to generate an equalized output signal based on the pre-tilted input signal and further based on the output signal,
where the input signal is based on the equalized output signal.

14. The cable communication system according to claim 13, wherein the digital equalizer circuit configured to generate the equalized output signal based on the pre-tilted input signal and further based on the output signal includes the digital equalizer circuit configured to generate the equalized output signal such that a deviation of the output signal from the pre-tilted input signal satisfies one or more criteria.

15. The cable communication system according to claim 13, further comprising an analog-to-digital converter (ADC) configured to convert the output signal from an analog version to a digital version prior to providing the output signal to the digital equalizer circuit.

16. The cable communication system according to claim 1, wherein each of the TC input signal and the TC output signal is an analog signal.

17. The cable communication system according to claim 1, wherein the TC output signal is such that about 50% of a signal power of the TC output signal is in a top 10% of a frequency spectrum of the TC output signal.

18. A cable communication system, comprising:
a tilt compensation (TC) circuit configured to receive a TC input signal, and apply a tilt compensation to the TC input signal to generate a TC output signal;
a digital tilt reference circuit, configured to generate a pre-tilted input signal based on a signal provided by a signal source by applying, to a digital version of the signal provided by the signal source, a frequency response configured to emulate a frequency response of the TC circuit; and
a digital equalizer circuit, configured to generate an equalized output signal based on the pre-tilted input signal and further based on an output of a segmented power amplifier (PA) circuit,
where:
   the TC input signal is based on the equalized output signal,
   the segmented PA circuit includes a plurality of PAs, each PA configured to amplify a portion of a PA input signal in a different frequency band to generate a PA segment output signal,
   the PA input signal is based on the TC output signal, and
   the output of the segmented PA circuit includes a combination of the PA segment output signals from the plurality of PAs.

19. The cable communication system according to claim 18, wherein the TC circuit includes a plurality of TC segments, each TC segment corresponding to a different one of the plurality of PAs and configured to apply the tilt compensation to a portion of the TC input signal in the frequency band for which the corresponding one of the plurality of PAs is configured to amplify the portion of the PA input signal.

20. The cable communication system according to claim 18, wherein the TC circuit is configured to apply the tilt compensation to a digital version of the TC input signal.

21. The cable communication system according to claim 18, wherein the TC circuit is configured to apply the tilt compensation to an analog version of the TC input signal.

* * * * *